(12) United States Patent
Kobayashi et al.

(10) Patent No.: US 7,915,088 B2
(45) Date of Patent: Mar. 29, 2011

(54) WIRING BOARD MANUFACTURING METHOD, SEMICONDUCTOR DEVICE MANUFACTURING METHOD AND WIRING BOARD

(75) Inventors: Kazuhiro Kobayashi, Nagano (JP); Junichi Nakamura, Nagano (JP); Kentaro Kaneko, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 360 days.

(21) Appl. No.: 12/099,322

(22) Filed: Apr. 8, 2008

(65) Prior Publication Data

US 2008/0258300 A1    Oct. 23, 2008

(30) Foreign Application Priority Data

Apr. 13, 2007 (JP) ................................ 2007-105965

(51) Int. Cl.
*H01L 21/00* (2006.01)

(52) U.S. Cl. ............ 438/125; 29/847; 29/852; 174/258; 174/260; 174/262; 257/736; 257/737; 257/738; 257/739; 257/777; 257/778; 257/E23.069; 257/E21.511; 257/E23.062; 257/E29.295; 257/E21.505; 438/108; 438/533; 438/610; 438/611; 438/612; 438/613; 438/614; 438/615; 438/616; 438/617; 438/618; 438/622

(58) Field of Classification Search .................... None
See application file for complete search history.

(56) References Cited

U.S. PATENT DOCUMENTS 6,418,615 B1    7/2002 Rokugawa et al.
2004/0060174 A1*  4/2004 Imafuji et al. ................. 29/831

FOREIGN PATENT DOCUMENTS

JP    10-209163    * 10/1998
JP    2000-323613    11/2000

* cited by examiner

*Primary Examiner* — Charles D Garber
*Assistant Examiner* — Yasser A Abdelaziez
(74) *Attorney, Agent, or Firm* — Rankin, Hill & Clark LLP

(57) ABSTRACT

A semiconductor device 100 has such a structure that a semiconductor chip 110 is flip-chip mounted on a wiring board 120. The wiring board 120 has a multilayer structure in which a plurality of wiring layers and a plurality of insulating layers are arranged, and has a structure in which insulating layers of a first layer 122, a second layer 124, a third layer 126 and a fourth layer 128 are provided. The first layer 122 has a first insulating layer 121 and a second insulating layer 123. A protruded portion 132 which is protruded in a radial direction (a circumferential direction) from an outer periphery at one surface side of a first electrode pad 130 is formed on a whole periphery over a boundary surface between the first insulating layer 121 and the second insulating layer 123.

4 Claims, 32 Drawing Sheets

(DFR REMOVAL)

(ROUGHENING TREATMENT)

WIRING BOARD MANUFACTURING METHOD, SEMICONDUCTOR DEVICE MANUFACTURING METHOD AND WIRING BOARD

BACKGROUND OF THE INVENTION

The present invention relates to a method of manufacturing a wiring board, a method of manufacturing a semiconductor device, and the wiring board, and more particularly to a method of manufacturing a wiring board which is constituted to enhance a reliability of an electrode pad forming portion of a multilayer substrate, a method of manufacturing a semiconductor device, and the wiring board.

For example, as one of methods of forming a BGA (Ball Grid Array) ball to be used for connecting a bare chip to a substrate or connecting a package substrate to a mother board, there has been known a manufacturing method of forming a plurality of electrodes on a substrate, then forming a solder resist having holes communicating with the electrodes, fusing, through a heat treatment (a reflow), a solder ball put on an opening of each of the holes and bonding the solder ball thus fused to the electrode in the hole, and forming a solder bump in a protruding state on a surface of the solder resist.

On the other hand, a package having a bare chip mounted on a multilayer substrate has also been developed with a reduction in a size of the bare chip and an increase in an integration (for example, see Patent Document 1).

FIG. 1 shows an example of a structure of a conventional wiring board. In the structure of the board shown in FIG. 1, layers are arranged in such a manner that an outer periphery of an electrode pad 10 is covered with a first insulating layer 12 and an upper surface of the electrode pad 10 is covered with a second insulating layer 13, and a via 14 extended upward from a center of the upper surface of the electrode pad 10 penetrates through the second insulating layer 13 and is thus connected to a wiring portion 16 in an upper part. The electrode pad 10 has a structure in which an Au layer 17 and an Ni layer 18 are arranged and is provided in such a manner that a surface of the Au layer 17 is exposed from the first insulating layer 12 and the via 14 is connected to the Ni layer 18.

Furthermore, a semiconductor chip is mounted on the electrode pad 10 through a solder bump in some cases, and a solder ball or a pin is bonded to the electrode pad 10 in the other cases. In a wiring board having a multilayer structure, thus, the electrode pad 10 is used as a bare chip loading pad or an external connecting pad.

[Patent Document 1]
Japanese Patent No. 3635219 (JP-A-2000-323613)

In the wiring board shown in FIG. 1, however, the outer periphery of the electrode pad 10 is comparatively smooth. Therefore, an adhesion to the first insulating layer 12 is small. When heating is carried out through a reflow treatment, there is a possibility that a thermal stress might be applied based on a difference in a thermal expansion between the first insulating layer 12 and the electrode pad 10, resulting in the generation of a delamination in a boundary portion provided in contact with the outer periphery of the electrode pad 10 and a breakage of a part of the first insulating layer 12.

In the case in which a part of the first insulating layer 12 provided in contact with an outer periphery of a corner portion (B portion) of the electrode pad 10 is broken off due to heating through the reflow treatment, furthermore, there is a problem in that a crack 20 might be generated from a corner portion (A portion) of the electrode pad 10 toward the second insulating layer 13.

In the case in which the crack 20 is enlarged, moreover, there is a possibility that the wiring portion 16 provided on the second insulating layer 13 might be cut.

SUMMARY OF THE INVENTION

In consideration of the circumstances, therefore, it is an object of the invention to provide a method of manufacturing a wiring board, a method of manufacturing a semiconductor device, and the wiring board which solve the problems.

In order to solve the problems, the invention has the following means.

According to a first aspect of the invention, there is provided a method of manufacturing a wiring board, including:
a first step of forming a first insulating layer on a support substrate;
a second step of forming, on the first insulating layer, an opening for exposing the support substrate;
a third step of forming, on the opening, an electrode pad having a protruded portion which is protruded in a circumferential direction from the opening provided on the first insulating layer;
a fourth step of forming a second insulating layer on the first insulating layer on which the electrode pad is provided;
a fifth step of forming, on the second insulating layer, a wiring layer to be electrically connected to the electrode pad; and
a sixth step of removing the support substrate to expose the electrode pad.

According to a second aspect of the invention, there is provided a method of manufacturing a wiring board, including:
a first step of forming a resist on a support substrate;
a second step of forming, on the resist, an opening for exposing the support substrate;
a third step of forming, on the opening, an electrode pad having a protruded portion which is protruded in a circumferential direction from the opening provided on the resist;
a fourth step of removing the resist;
a fifth step of forming an insulating layer to cover a surface of the electrode pad;
a sixth step of forming, on a surface of the insulating layer, a wiring layer to be electrically connected to the electrode pad; and
a seventh step of removing the support substrate to expose the electrode pad.

According to a third aspect of the invention, there is provided the method of manufacturing a wiring board, further including:
a step of carrying out a roughening treatment over the opening of the first insulating layer.

According to a forth aspect of the invention, there is provided the method of manufacturing a wiring board, further including:
a step of removing the resist and then carrying out a roughening treatment over the surface of the electrode pad.

According to a fifth aspect of the invention, there is provided the method of manufacturing a wiring board according to the first aspect, wherein
the support substrate is formed of a metal;
the third step includes a step of forming a metal layer of the same type as the support substrate between the support substrate and the electrode pad, and
the sixth step serves to remove the support substrate and to remove the metal layer in such a manner that an exposed surface of the electrode pad forms a concave portion.

According to a sixth aspect of the invention, there is provided the method of manufacturing a wiring board according to the second aspect, wherein the support substrate is formed of a metal;

the third step includes a step of forming a metal layer of the same type as the support substrate between the support substrate and the electrode pad; and the seventh step serves to remove the support substrate and to remove the metal layer in such a manner that an exposed surface of the electrode pad forms a concave portion.

According to a seventh aspect of the invention, there is provided a method of manufacturing a semiconductor device using the method of manufacturing a wiring board according to any one of the first to sixth aspects, including the step of:

mounting a semiconductor chip on the electrode pad through a solder bump.

According to an eighth aspect of the invention, there is provided a wiring board including:

an electrode pad; and an insulating layer arranged to cover a surface of the electrode pad, wherein a protruded portion which is protruded in a circumferential direction from an outer periphery at one surface side of the electrode pad surrounded by the insulating layer is formed on the electrode pad.

According to a ninth aspect of the invention, there is provided the wiring board according to the eighth aspect, wherein an exposed surface at the other surface side of the electrode pad is formed in a concave position from a surface of the insulating layer; and a concave portion is formed on the surface of the insulating layer.

According to a tenth aspect of the invention, there is provided the wiring board according to the eighth or ninth aspect, wherein the insulating layer includes:

a first insulating layer having an opening on which the electrode pad is formed; and a second insulating layer arranged on a surface of the electrode pad and that of the first insulating layer, and wherein the protruded portion of the electrode pad is protruded to an outside of the opening so as to be provided between the first insulating layer and the second insulating layer.

According to the invention, it is possible to inhibit the advance of a crack generated on the insulating layer from the corner portion of the outer periphery of the electrode pad through the protruded portion which is protruded in a circumferential direction from the outer periphery of the electrode pad surrounded by the insulating layer, thereby preventing a disconnection of the wiring layer due to the crack.

DETAILED DESCRIPTION OF THE PREFERRED EMBODIMENTS

The best mode for carrying out the invention will be described below with reference to the drawings.

First Example

Figure 2:
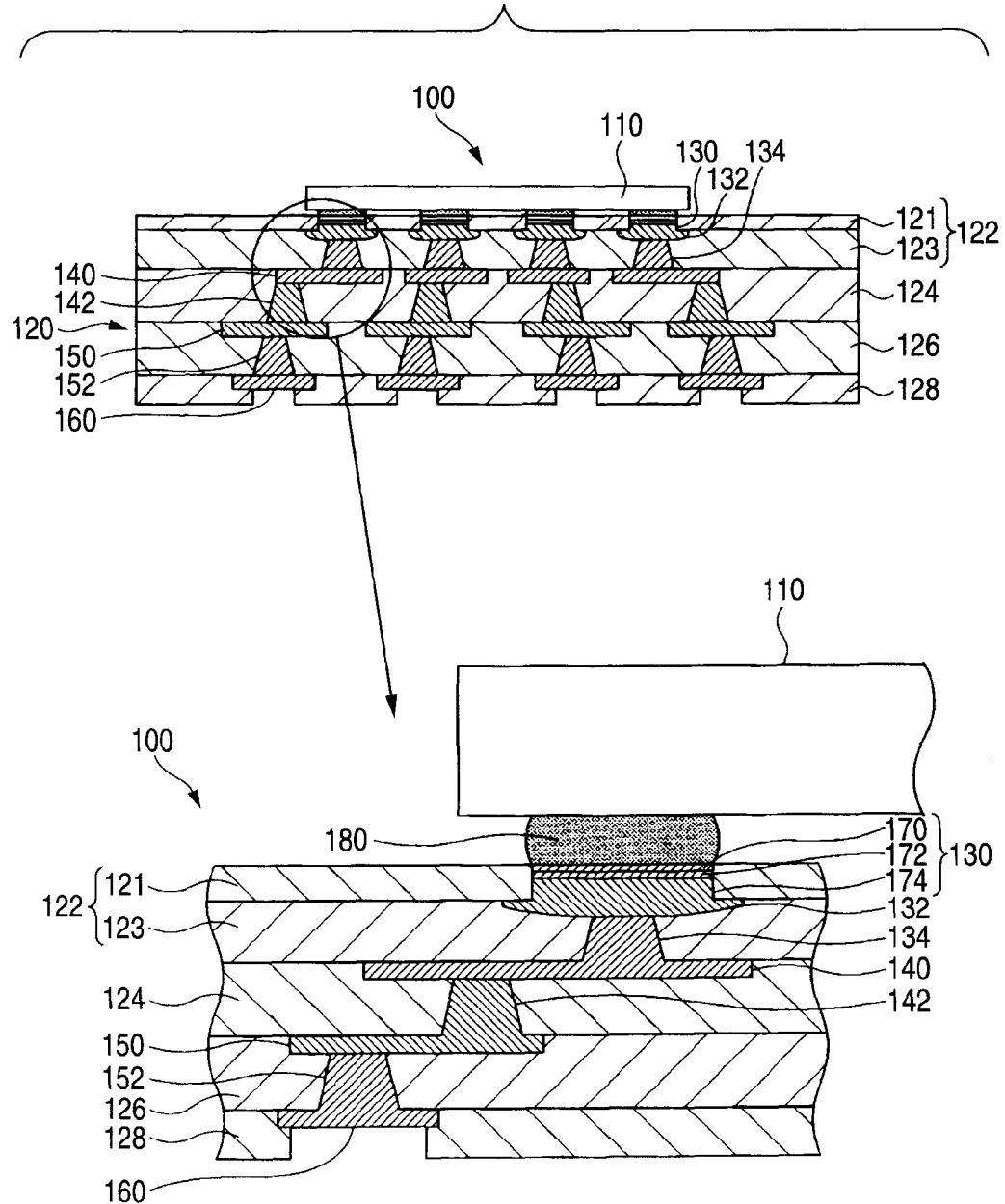
FIG. 2 is a longitudinal sectional view showing a semiconductor device to which a first example of a wiring board according to the invention is applied.

FIG. 2 is a longitudinal sectional view showing a semiconductor device to which a first example of a wiring board according to the invention is applied. As shown in FIG. 2, a semiconductor device 100 has such a structure that a semiconductor chip 110 is flip-chip mounted on a wiring board 120, for example. The wiring board 120 has a multilayer structure in which a plurality of wiring layers and a plurality of insulating layers are arranged, and has a structure in which respective insulating layers of a first layer 122, a second layer 124, a third layer 126 and a fourth layer 128 which have wiring layers are arranged in a vertical direction according to the example. Moreover, the first layer 122 has a structure in which a first insulating layer 121 and a second insulating layer 123 are arranged on a first electrode pad 130. Each of the insulating layers is formed by an insulating resin such as an epoxy resin or a polyimide resin, for example.

The first insulating layer 121 and the insulating layer of the fourth layer 128 over which a solder connection is to be carried out may be formed by an insulating resin to be a solder resist (formed by an acryl resin or an epoxy resin). In the semiconductor device 100, moreover, an underfill resin having an insulating property may be filled between the semiconductor chip 110 and the wiring board 120.

The first layer 122 in an uppermost stage is provided with the first electrode pad 130 and a via 134 to which a terminal of the semiconductor chip 110 is to be flip-chip connected. Moreover, the second layer 124 provided under the first layer 122 is provided with a wiring layer 140 and a via 142 which are conducted to the via 134. Furthermore, the third layer 126 provided under the second layer 124 has a wiring layer 150 and a via 152 which are conducted to the via 142. In addition, the fourth layer 128 provided under the third layer 126 has a second electrode pad 160 conducted to the via 152.

Moreover, the first layer 122 has the first insulating layer 121 formed to surround an outer periphery of the first electrode pad 130, and a protruded portion 132 which is protruded in a radial direction (a circumferential direction) from the outer periphery at one surface side of the first electrode pad 130 is formed between the first insulating layer 121 and the second insulating layer 123. The protruded portion 132 is formed to take an L shape which is bent at a right angle from the outer periphery of the first electrode pad 130 as seen from a side (namely, the protruded portion 132 has a mushroom shape having a cap of which upper surface is curved), and the advance of a crack in the first insulating layer 121 can be inhibited by the L-shaped portion. Moreover, the other surface side of the first electrode pad 130 is an exposed surface which is exposed from the first insulating layer 121, and a solder bump 180 is connected thereto.

The first electrode pad 130 has a three-layer structure in which Au, Ni and Cu layers 170, 172 and 174 having a high bonding property to a solder are arranged. Accordingly, a surface of the Au layer 170 is exposed at the other surface side of the first electrode pad 130.

The protruded portion 132 is formed by the Cu layer 174 as will be described below, and is formed integrally with the first electrode pad 130 at a step of carrying out electrolytic plating over the Cu layer 174. Moreover, the Au layer 170 is exposed from the upper surface side of the wiring board 120 (a semiconductor chip mounting side), and the solder bump 180 of the semiconductor chip 110 is connected to the Au layer 170.

The terminal of the semiconductor chip 110 is soldered to the Au layer 170 through the solder bump 180 and is thus conducted to the first electrode pad 130. The solder bump 180 is formed by putting a solder ball on the first electrode pad 130 and carrying out a reflow (a heat treatment).

The protruded portion 132 which is protruded in the radial direction (the circumferential direction) from the outer periphery at one surface side of the first electrode pad 130 is formed on a whole periphery over a boundary surface between the first insulating layer 121 and the second insulating layer 123. The protruded portion 132 is formed to have a larger diameter than an outside diameter of the first electrode pad 130. In the example, if the first electrode pad 130 has a via diameter of approximately 70 to 100 μm and a thickness of approximately 5 μm, for instance, the protruded portion 132 is formed in such a manner that a range overlapping with the first insulating layer 121 is approximately 2 to 10 μm (suitably 5 μm) and a thickness is approximately 2 to 10 μm (suitably 5 μm).

The protruded portion 132 is protruded in the radial direction from the outer periphery at one surface side of the first electrode pad 130 so that a direction of advance of the thermal stress through the reflow treatment is blocked by the protruded portion 132 and is absorbed in a direction along the boundary surface between the first insulating layer 121 and the second insulating layer 123, for example. Even if a delamination is generated so that a part of the first insulating layer 121 covering the outer periphery of the first electrode pad 130 is broken off, therefore, it is possible to prevent a crack from being generated on the second insulating layer 123.

The first electrode pad 130 may have a structure in which only the Au layer 170 and the Ni layer 172 are arranged in such a manner that the Au layer 170 is exposed to the surface of the wiring board 120. For the first electrode pad 130, moreover, Au/Pd/Ni, Sn/Ni, Sn—Ag (an alloy of tin and silver) and Sn can also be used in place of the Au layer 170 and the Ni layer 172. Furthermore, the first electrode pad 130 may be formed of only the metals. In addition, it is a matter of course that each of the metals can be used without a restriction and a combination of the respective metals is not restricted to the combination.

Figure 3A:
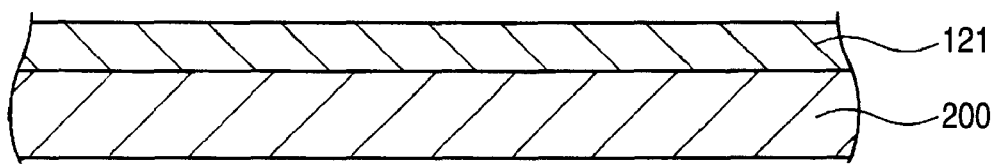
FIG. 3A is a view for explaining a method (No. 1) of manufacturing the wiring board according to the first example.

A method of manufacturing the wiring board 120 to be used in the semiconductor device 100 will be described with reference to FIGS. 3A to 3N. FIGS. 3A to 3N are views for explaining methods (Nos. 1 to 14) of manufacturing the wiring board 120 according to the first example. In FIGS. 3A to 3N, the respective layers are arranged in a facedown direction in which the first electrode pad 130 is provided on a lower surface side of the wiring board 120 (a vertically reverse direction to the lamination structure shown in FIG. 2).

In FIG. 3A, first of all, there is prepared a support substrate 200 formed by a flat Cu plate or a Cu foil which has a predetermined thickness. A resin film such as an epoxy resin or a polyimide resin is laminated as a plating resist on an upper surface of the support substrate 200 so that the first insulating layer 121 is formed.

Figure 3B:
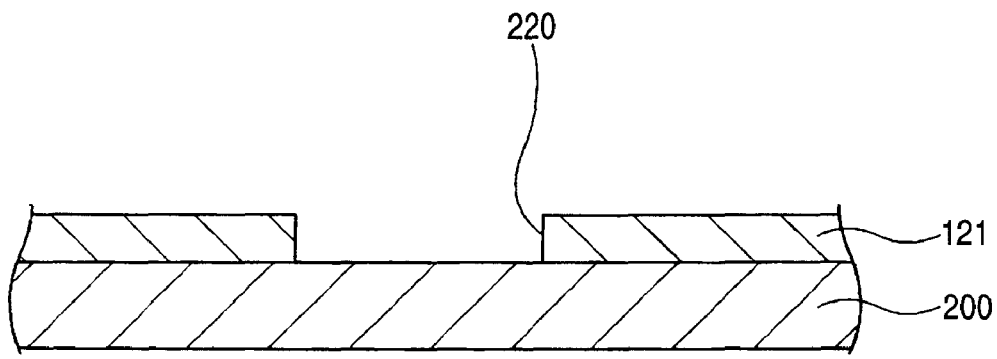
FIG. 3B is a view for explaining a method (No. 2) of manufacturing the wiring board according to the first example.

In FIG. 3B, an opening 220 for forming a first electrode pad is provided so as to expose a part of the support substrate 200 to the first insulating layer 121. An inside diameter of the opening 220 corresponds to an outside diameter of the first electrode pad 130. In the case in which the first insulating layer 121 is formed by a thermosetting resin, the opening 220 is formed through a laser beam. In the case in which the first insulating layer 121 is formed by a photosensitive resin, the opening 220 is formed through photolithography.

Figure 3C:
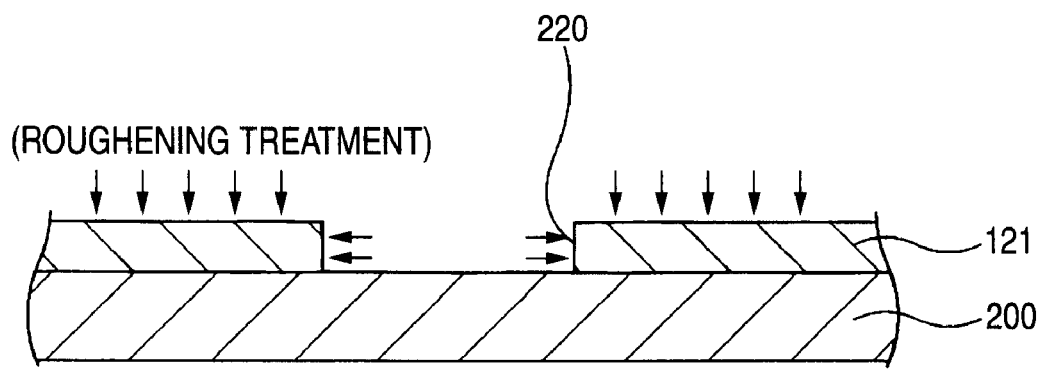
FIG. 3C is a view for explaining a method (No. 3) of manufacturing the wiring board according to the first example.

In FIG. 3C, a roughening treatment is carried out to roughen the surface of the first insulating layer 121 and an internal wall of the opening 220. It is preferable that a surface roughness obtained by the roughening treatment should be set to have Ra=approximately 0.25 to 0.75 μm, for example.

Figure 3D:
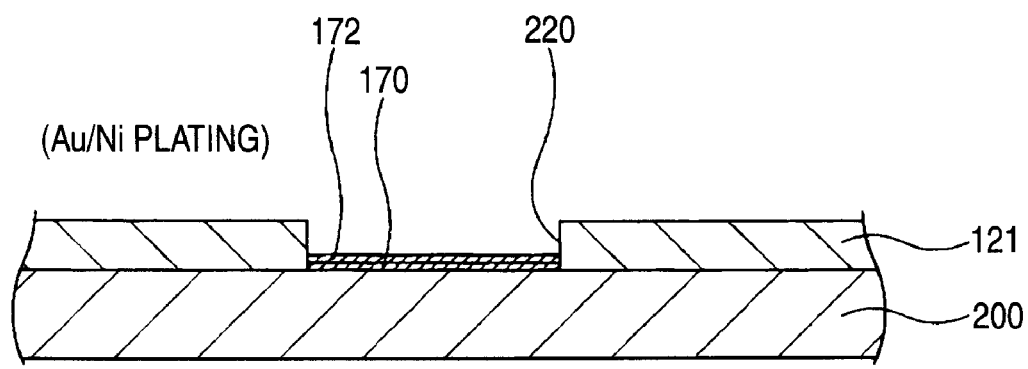
FIG. 3D is a view for explaining a method (No. 4) of manufacturing the wiring board according to the first example.

In FIG. 3D, the support substrate 200 is used as a feeding layer to carry out electrolytic plating so that Au is deposited on the support substrate 200 in the opening 220 to form the Au layer 170, and furthermore, Ni is deposited on the surface of the Au layer 170 to arrange the Ni layer 172.

Figure 3E:
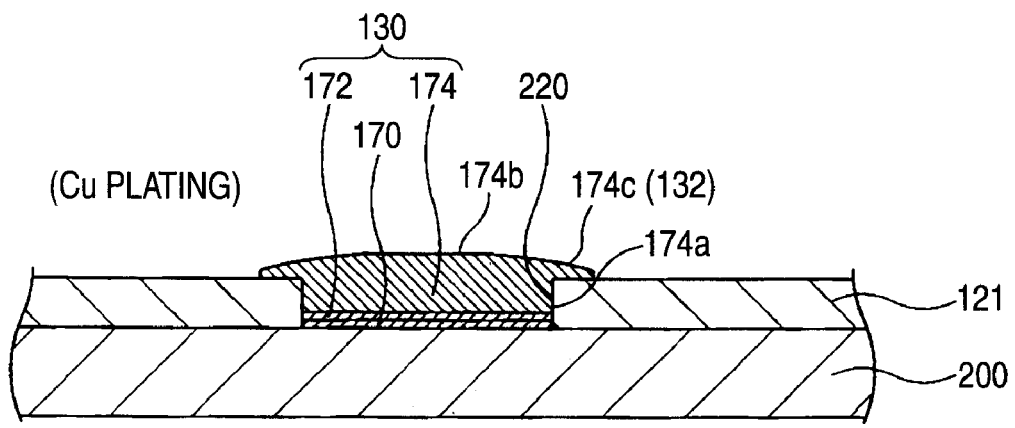
FIG. 3E is a view for explaining a method (No. 5) of manufacturing the wiring board according to the first example.

In FIG. 3E, furthermore, the support substrate 200 is used as the feeding layer to carry out electrolytic Cu plating so that Cu is deposited on the Ni layer 172 in the opening 220 to arrange the Cu layer 174. Consequently, there is formed the first electrode pad 130 having a three-layer structure including the Au layer 170, the Ni layer 172 and the Cu layer 174.

The Cu layer 174 has a cylindrical portion 174a which is arranged in the opening 220 through the electrolytic Cu plating, a swollen portion 174b which is swollen upward from the upper surface of the first insulating layer 121 through a growth of Cu, and a flange portion 174c (forming the protruded portion 132) protruded in the radial direction (the circumferential direction) from the swollen portion 174b and formed on the upper surface of the first insulating layer 121. The surface of the first insulating layer 121 and the internal wall of the opening 220 are subjected to the roughening treatment so that an adhesion of the cylindrical portion 174a and the flange portion 174c can be enhanced and a delamination can be prevented from being generated by a thermal stress.

A height of the swollen portion 174b and a protrusion length in a horizontal direction of the flange portion 174c in the Cu layer 174 can be set to have optional dimensions depending on a time required for the electrolytic Cu plating. Since the upper surface of the swollen portion 174b has various shapes depending on a degree of the deposition of Cu, moreover, it is a plane, a curved surface or a wavy surface having concavo-convex portions and it takes a curved shape for convenience of explanation in the example.

Figure 3F:
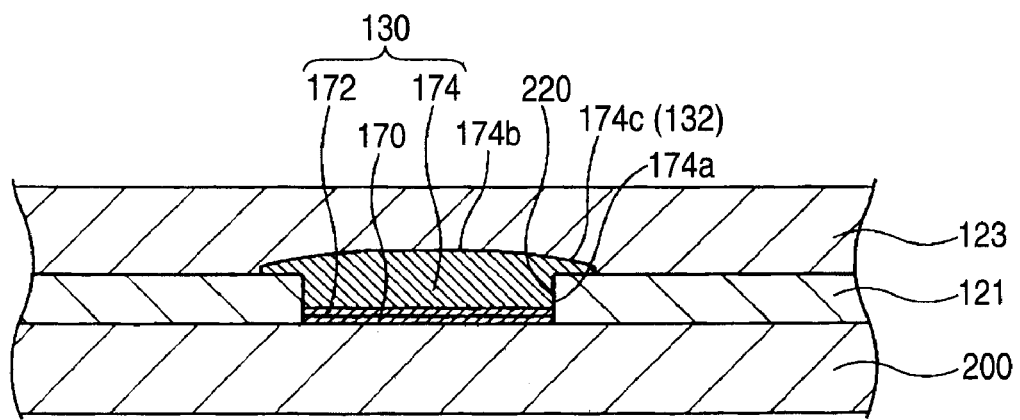
FIG. 3F is a view for explaining a method (No. 6) of manufacturing the wiring board according to the first example.

In FIG. 3F, a resin film such as an epoxy resin or a polyimide resin is laminated on the surface of the first insulating layer 121 and the surface of the electrode pad 130 so that the second insulating layer 123 is formed.

Figure 3G:
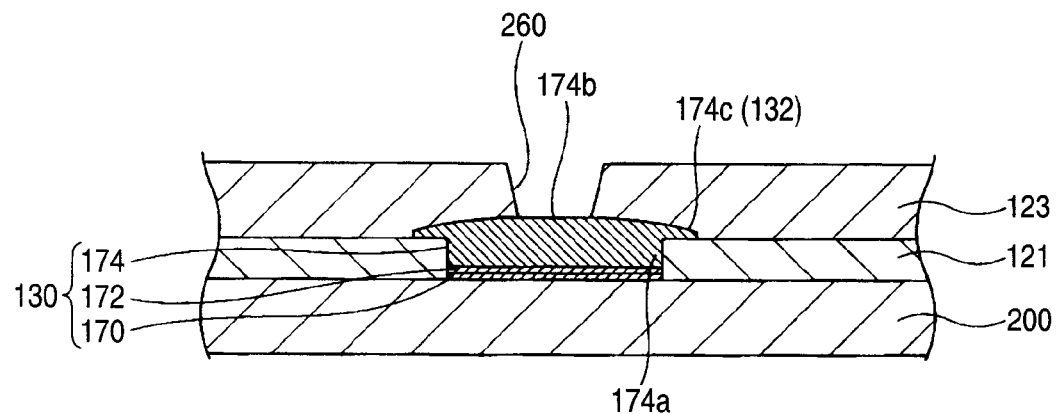
FIG. 3G is a view for explaining a method (No. 7) of manufacturing the wiring board according to the first example.

In FIG. 3G, a laser beam is irradiated on the second insulating layer 123 to form a via hole 260 in such a manner that a part of the surface of the first electrode pad 130 (the swollen portion 174b of the Cu layer 174) is exposed, for example.

Figure 3H:
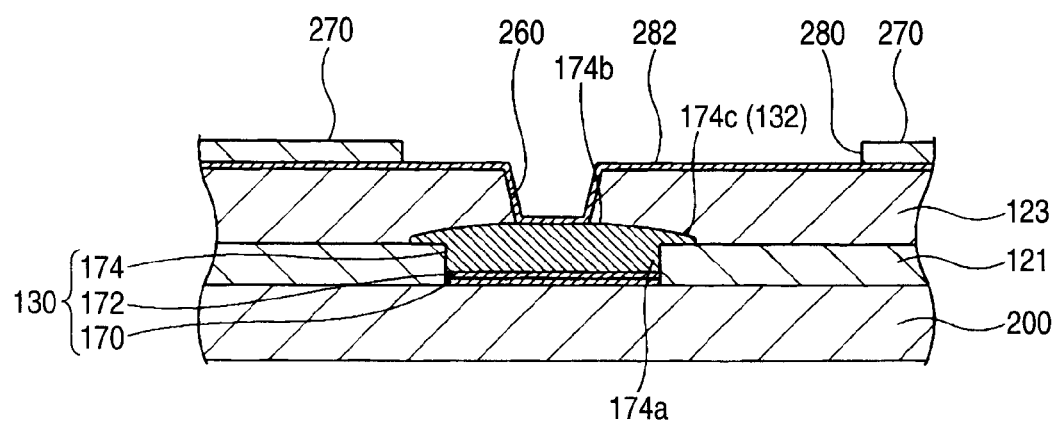
FIG. 3H is a view for explaining a method (No. 8) of manufacturing the wiring board according to the first example.

In FIG. 3H, a seed layer 282 is formed, by nonelectrolytic copper plating, on a surface of the second insulating layer 123, an internal surface of the via hole 260, and an upper surface of the Cu layer 174 which is exposed through the via hole 260. For a method of forming the seed layer 282, another thin film forming method (a sputtering method or a CVD method) may be used or a conducive metal other than Cu may be formed. Subsequently, a dry film resist 270 is laminated as a plating resist on the surface (the upper surface) of the second insulating layer 123. Then, patterning (exposure and development) is carried out over the dry film resist 270 to form an opening 280 for forming a wiring pattern through which a part of the seed layer 282 is exposed. A liquid resist may be applied in place of the dry film resist 270.

Figure 3I:
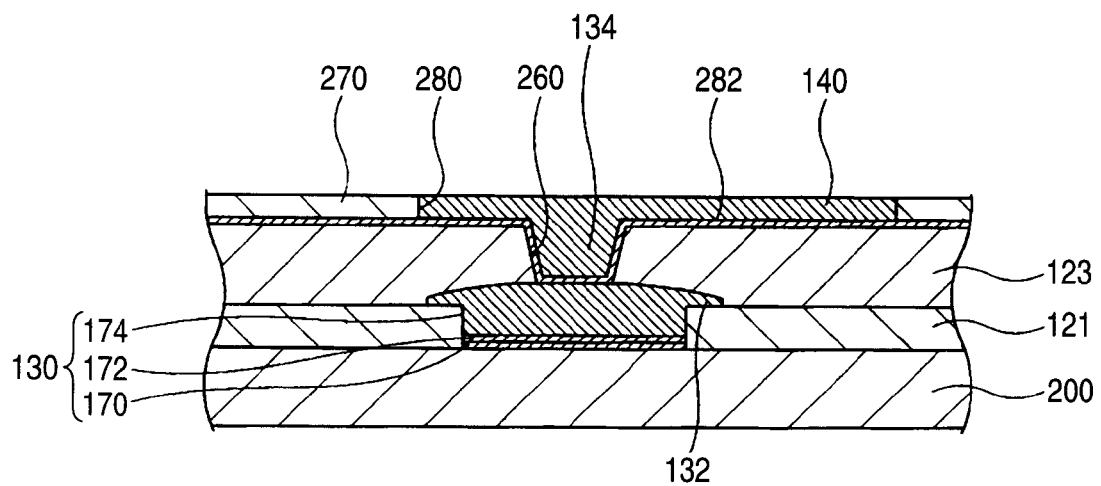
FIG. 3I is a view for explaining a method (No. 9) of manufacturing the wiring board according to the first example.

In FIG. 3I, electrolytic Cu plating is carried out by feeding the seed layer 282 so that Cu is deposited on the via hole 260 and the seed layer 282 in the opening 280 for forming a wiring pattern to form the via 134 and the wiring pattern layer 140.

Figure 3J:
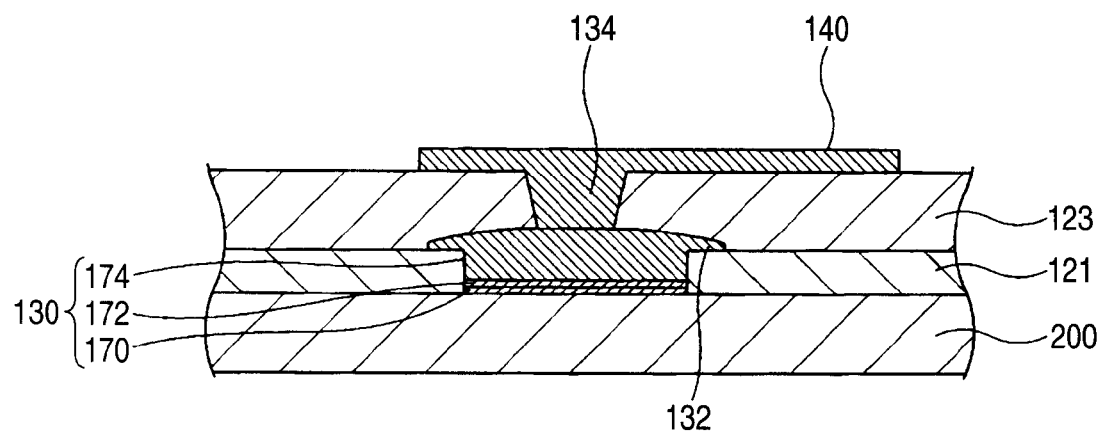
FIG. 3J is a view for explaining a method (No. 10) of manufacturing the wiring board according to the first example.

In FIG. 3J, the dry film resist 270 and the seed layer 282 other than the seed layer 282 provided under the wiring pattern layer 140 are removed from the second insulating layer 123. Consequently, the wiring pattern layer 140 is left on the second insulating layer 123. In FIG. 3J and succeeding drawings, the seed layer 282 is not shown.

Figure 3K:
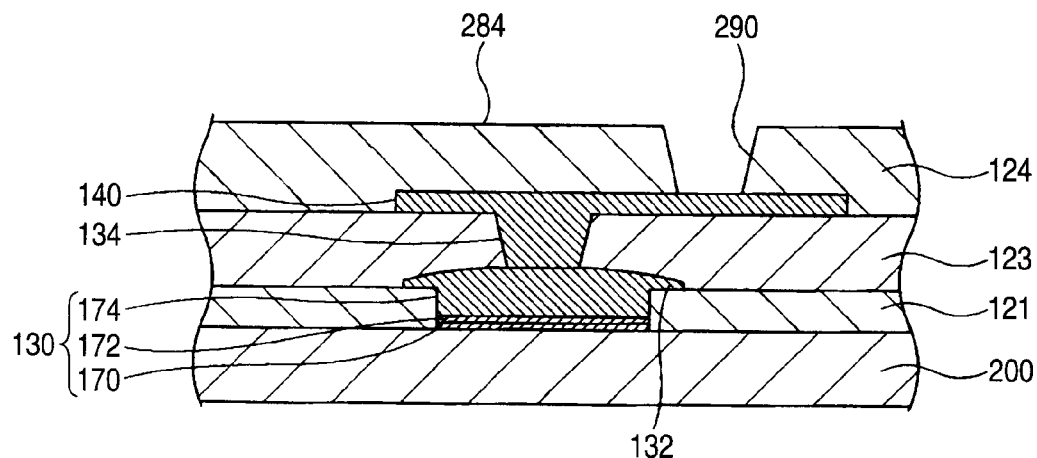
FIG. 3K is a view for explaining a method (No. 11) of manufacturing the wiring board according to the first example.

In FIG. 3K, a roughening treatment is carried out over the surfaces of the second insulating layer 123 and the wiring pattern layer 140 and a film-shaped so-called built-up resin 284 containing an epoxy resin as a main component (a content of a filler may be properly changed corresponding to a hardness or a flexibility which is required) is then laminated to form the insulating layer of the second layer 124. Thereafter, a laser beam is irradiated to form a via hole 290 in such a manner that a part of the surface of the wiring pattern layer 140 is exposed, for example.

Subsequently, the steps of FIGS. 3G to 3K are repeated to form the via 142 of the second layer 124 and the wiring pattern layer 150 of the third layer 126. In the case in which at least four insulating and wiring layers are to be arranged, moreover, it is preferable that the steps of FIGS. 3G to 3K should be correspondingly repeated.

Figure 3L:
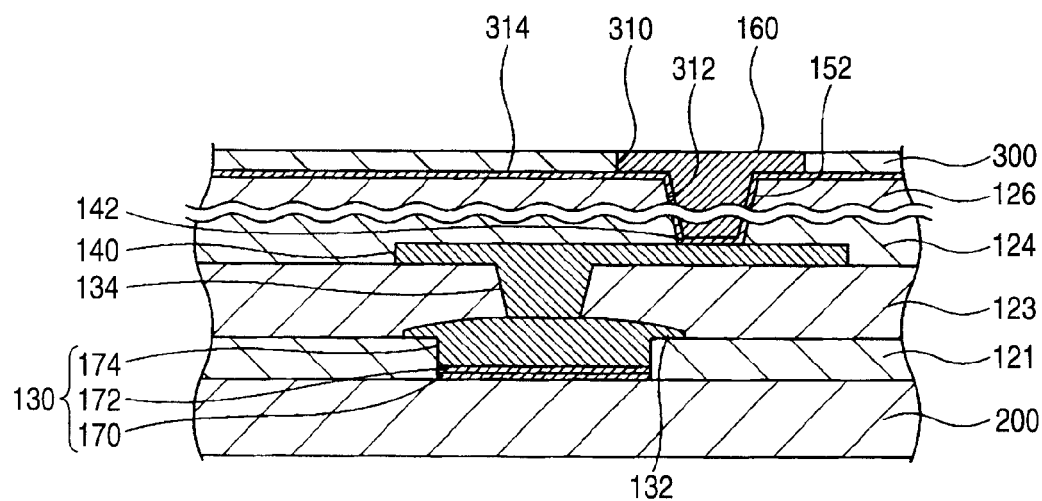
FIG. 3L is a view for explaining a method (No. 12) of manufacturing the wiring board according to the first example.

In FIG. 3L, a seed layer 314 is formed by Cu nonelectrolytic plating over the surface (upper surface) of the insulating layer of the third layer 126, and subsequently, a dry film resist 300 is laminated as a plating resist. A liquid resist may be applied in place of the dry film resist 300. For a method of forming the seed layer 314, moreover, a thin film forming method other than the nonelectrolytic Cu plating may be used or the seed layer 314 may be formed by a conductive metal other than Cu.

Then, patterning (exposure and development) is carried out over the dry film resist 300 to form an opening 310 for forming a second electrode pad in such a manner that a part of the seed layer 314 is exposed. Next, electrolytic Cu plating is carried out by feeding the seed layer 314 to deposit Cu in a via hole 312 and the opening 310, thereby forming the via 152 and the second electrode pad 160.

Figure 3M:
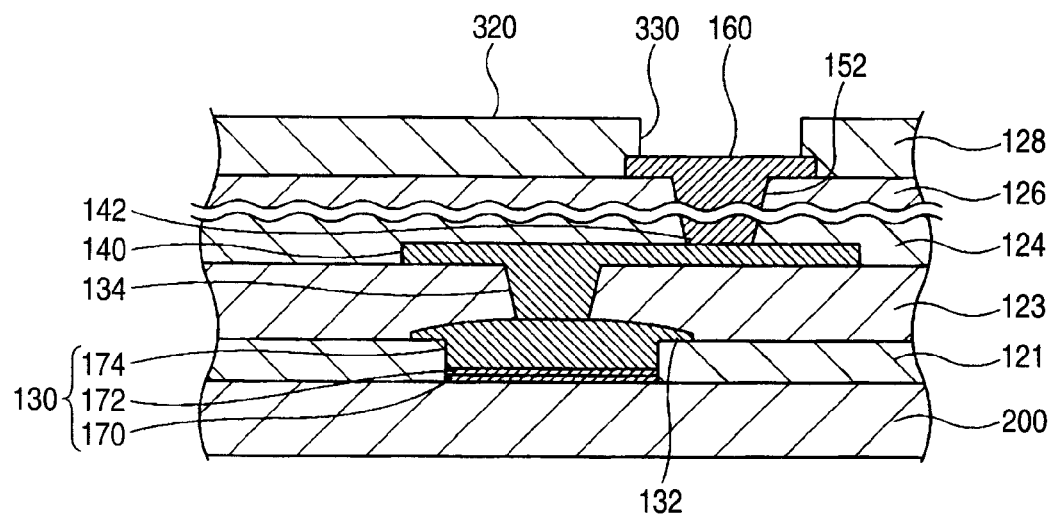
FIG. 3M is a view for explaining a method (No. 13) of manufacturing the wiring board according to the first example.
Figure 3N:
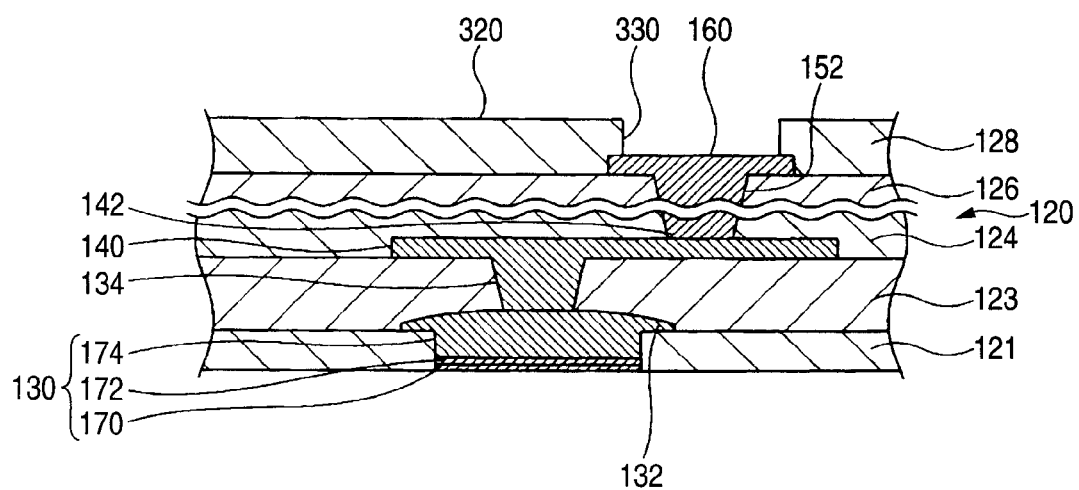
FIG. 3N is a view for explaining a method (No. 14) of manufacturing the wiring board according to the first example.

In FIG. 3M, the dry film resist 300 and the seed layer 314 other than the seed layer 314 provided under the second electrode pad 160 are removed. At steps to be carried out in FIG. 3M and the succeeding drawings, Cu in the seed layer 314 provided under the second electrode pad 160 is integrated. Therefore, the seed layer 314 is omitted.

Subsequently, a solder resist 320 is applied to the surface (upper surface) of the insulating layer of the third layer 126 and the insulating layer of the fourth layer 128 is thus formed, and an opening 330 is then formed in such a manner that a part of the second electrode pad 160 is exposed.

In FIG. 3N, the support substrate 200 is removed by wet etching so that the wiring board 120 is obtained. For the support substrate 200, it is also possible to stick two support substrates 200 in a vertical direction and to arrange the wiring board 120 on both surfaces at upper and lower surface sides thereof. In that case, the two support substrates 200 are divided into two parts and are removed by wet etching.

As shown in FIG. 2, then, a solder ball is put on the first electrode pad 130 of the wiring board 120 and a reflow is carried out so that each terminal of the semiconductor chip 110 is connected to the electrode pad 130 through the solder bump 180 and the semiconductor chip 110 is mounted on the wiring board 120. The step of mounting the semiconductor chip 110 on the wiring board 120 is properly selected. For example, there are the case in which the semiconductor chip 110 is mounted on the wiring board 120 according to a request of a customer and the case in which the semiconductor chip 110 is mounted on the wiring board 120 in a customer to which the wiring board 120 is delivered.

Moreover, the semiconductor chip 110 may be mounted on the wiring board 120 through wire bonding in place of the solder bump 180. Furthermore, the semiconductor chip 110 may be mounted on the wiring board 120 by soldering a pin in place of the solder bump 180.

In addition, in the case in which a thermal stress is generated in a reflow due to the formation of the solder bump 180, a direction of advance of the thermal stress is blocked by the protruded portion 132 and is absorbed in a direction along the boundary surface between the first insulating layer 121 and the second insulating layer 123 because the protruded portion 132 is formed to be protruded in the radial direction (the circumferential direction) from the outer periphery on one surface side of the first electrode pad 130. In the wiring board 120 according to the first example, therefore, it is possible to prevent a crack from being generated on the second insulating layer 123.

Figure 4:
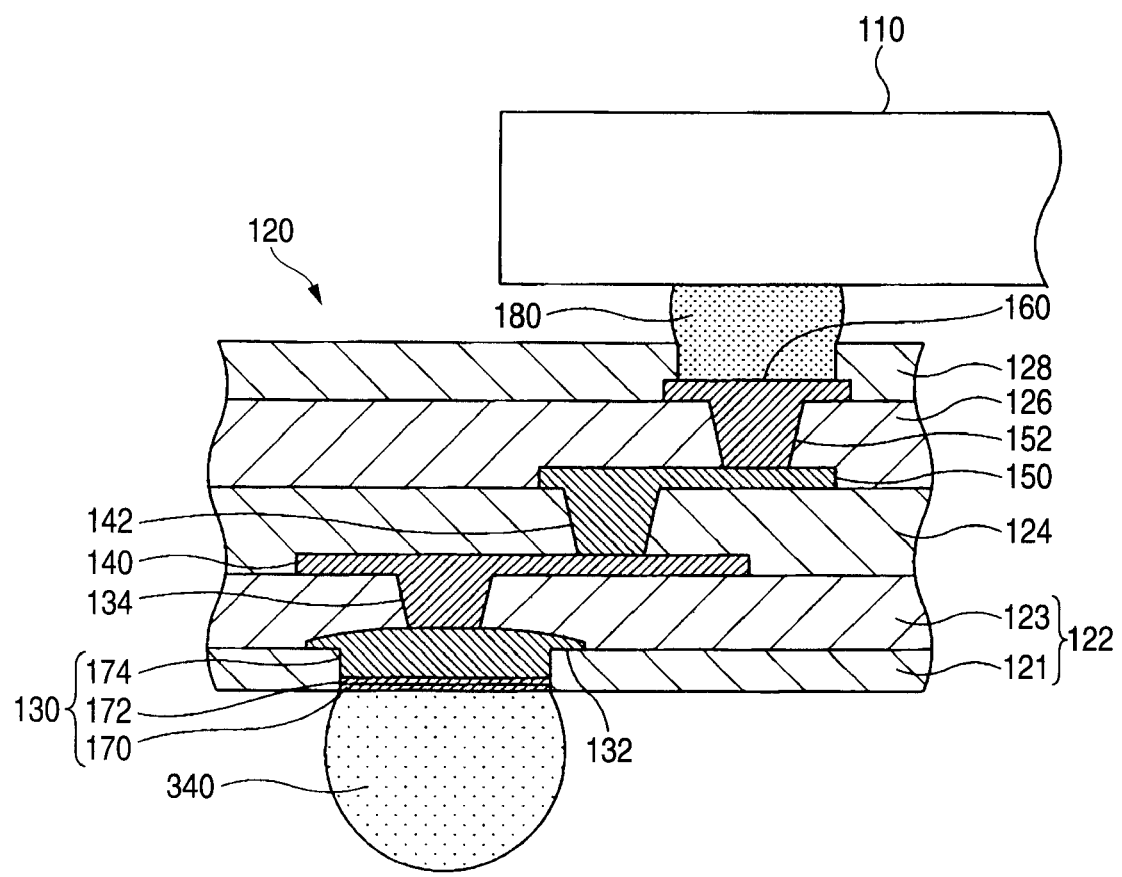
FIG. 4 is a view showing a variant of the first example.

FIG. 4 is a view showing a variant of the first example. As shown in FIG. 4, in the variant, the wiring board 120 is used in a reversely vertical direction to that in the case of the first example. More specifically, the semiconductor chip 110 is mounted on the second electrode pad 160 through the solder bump 180 and a solder bump 340 is formed on the first electrode pad 130 through a reflow of a solder ball.

The semiconductor chip 110 may be mounted on either the first electrode pad 130 or the second electrode pad 160 in the wiring board 120 as shown in FIGS. 2 and 4.

In the variant, a plated layer having Au and Ni layers arranged (in such a manner that the Au layer is exposed to a surface) may be provided on the second electrode pad 160. Moreover, it is also possible to use Au/Pd/Ni, Sn/Ni, Sn—Ag (an alloy of tin and silver) and Sn in place of the Au layer 170 and the Ni layer 172. Furthermore, the first electrode pad 130 may be formed by only the metals. In addition, it is a matter of course that each metal is not restricted to the metals but is usable and a combination of the respective metals is not restricted to the combination.

In the variant, furthermore, it is also possible to finish the semiconductor device by loading the semiconductor chip 110 onto the wiring board 120 and then removing the support substrate 200 at the step of FIG. 3M.

Also in the variant, an underfill resin having an insulating property may be filled between the semiconductor chip 110 and the wiring board 120.

Moreover, the semiconductor chip 110 may be mounted on the wiring board 120 through wire bonding in place of the solder bump 180. Furthermore, the semiconductor chip 110 may be mounted on the wiring board 120 by soldering a pin in place of the solder bump 180.

Second Example

Figure 1:
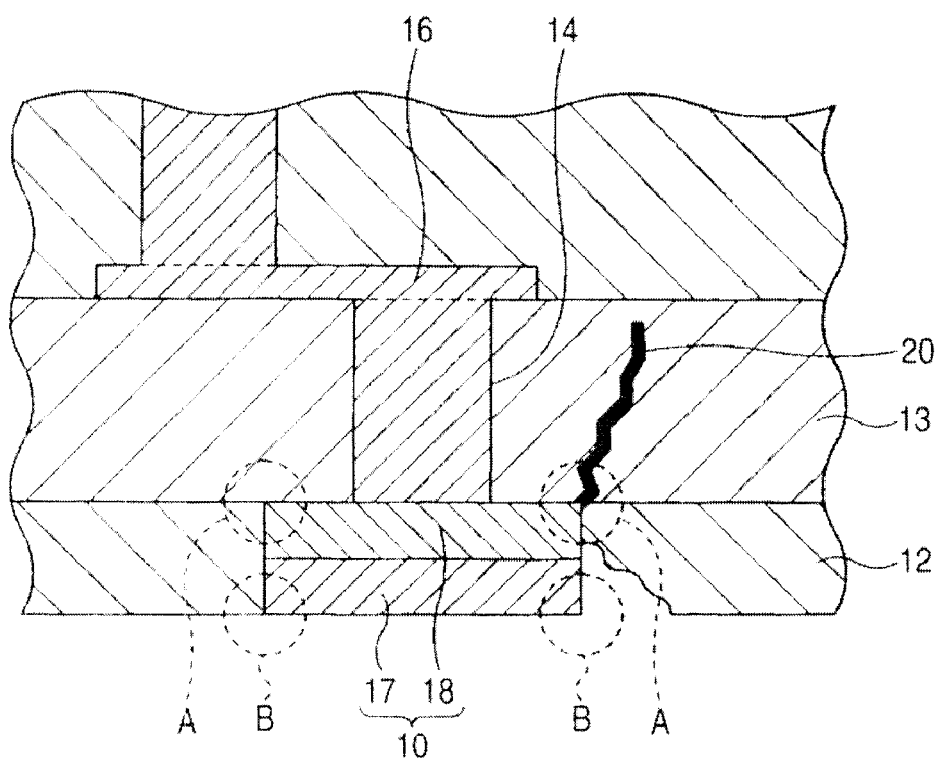
FIG. 1 is a view showing an example of a structure of a conventional wiring board.
Figure 5:
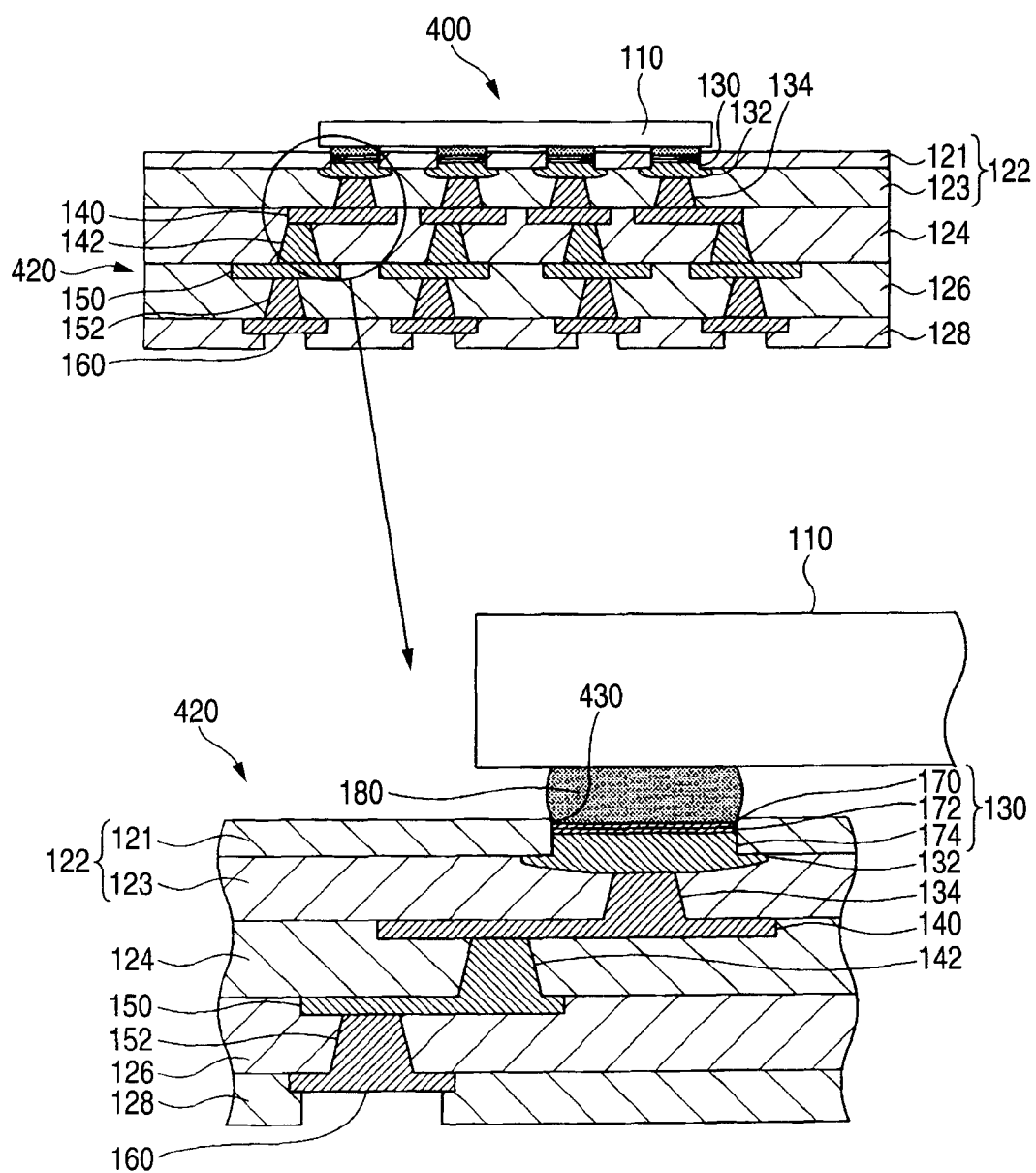
FIG. 5 is a longitudinal sectional view showing a semiconductor device to which a second example of the wiring board is applied.

FIG. 5 is a longitudinal sectional view showing a semiconductor device to which a second example of the wiring board is applied. In FIG. 5, the same portions as those in FIG. 1 have the same reference numerals and description thereof will be omitted.

As shown in FIG. 5, in a wiring board 420 to be used in a semiconductor device 400 according to the second example, there is formed an electrode opening (a concave portion) 430 in which a surface of a first electrode pad 130 (an end face on an Au layer 170 side) is concaved from a surface of a first insulating layer 121. Therefore, a solder bump 180 is formed on the Au layer 170 side by carrying out a reflow (a heat treatment) with a solder ball inserted in the electrode opening 430. In the semiconductor device 400 according to the second example, an underfill resin having an insulating property may be filled between a semiconductor chip 110 and the wiring board 420.

Figure 6A:
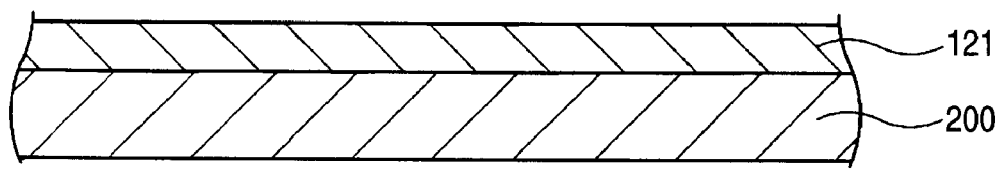
FIG. 6A is a view for explaining a method (No. 1) of manufacturing the wiring board according to the second example.

A method of manufacturing the wiring board 420 to be used in the semiconductor device 400 will be described with reference to FIGS. 6A to 6O. FIGS. 6A to 6O are views for explaining methods (Nos. 1 to 15) of manufacturing the wiring board 420 according to the second example. In FIGS. 6A to 6O, the respective layers are arranged in a facedown direction in which the first electrode pad 130 is provided on a lower surface side of the wiring board 420 (a vertically reverse direction to the lamination structure shown in FIG. 5).

Figure 6B:
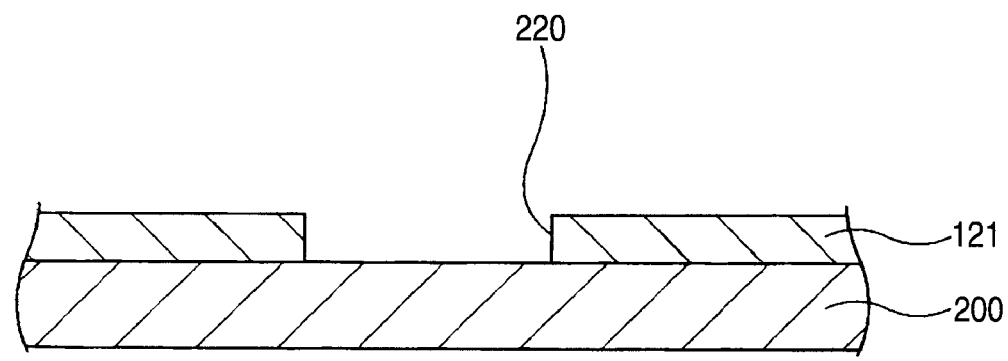
FIG. 6B is a view for explaining a method (No. 2) of manufacturing the wiring board according to the second example.
Figure 6C:
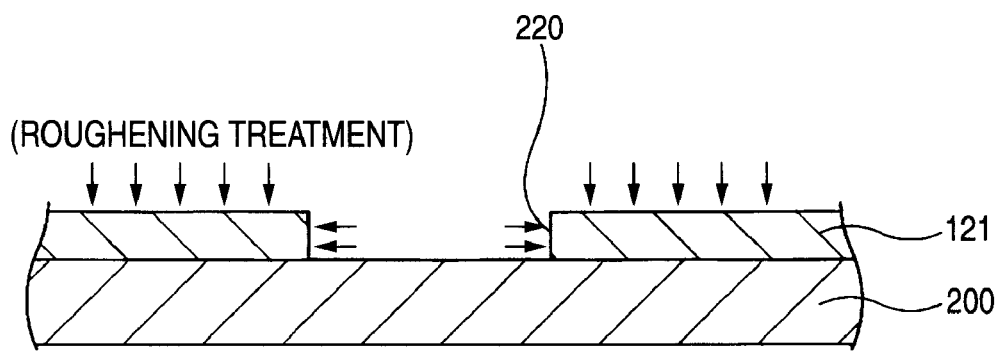
FIG. 6C is a view for explaining a method (No. 3) of manufacturing the wiring board according to the second example.

The steps shown in FIGS. 6A to 6C are the same as those in FIGS. 3A to 3C according to the first example. In FIG. 6A, there is prepared a support substrate 200 formed by a flat Cu plate or a Cu foil which has a predetermined thickness, and a resin film such as an epoxy resin or a polyimide resin is laminated on an upper surface of the support substrate 200 to form the first insulating layer 121.

In FIG. 6B, an opening 220 for forming a first electrode pad is formed so as to expose a part of the support substrate 200 to the first insulating layer 121 (through a laser beam or photolithography). An inside diameter of the opening 220 corresponds to an outside diameter of the first electrode pad 130.

In FIG. 6C, a roughening treatment is carried out to roughen the surface of the first insulating layer 121 and an internal wall of the opening 220. It is preferable that a surface roughness obtained by the roughening treatment should be set to have Ra=approximately 0.25 to 0.75 µm, for example.

Figure 6D:
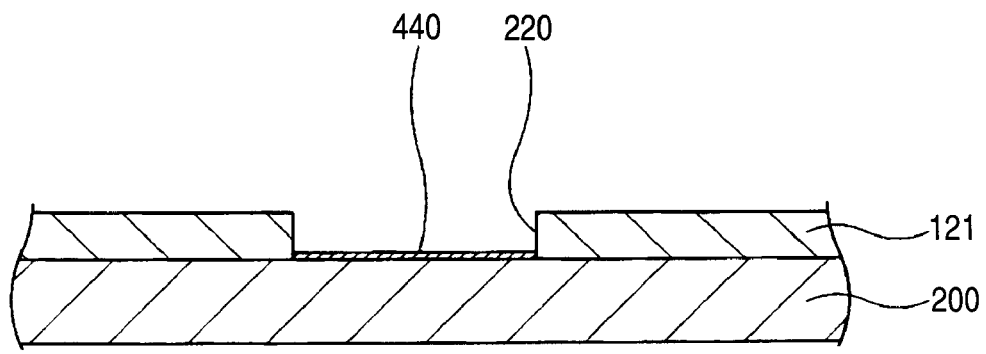
FIG. 6D is a view for explaining a method (No. 4) of manufacturing the wiring board according to the second example.

In FIG. 6D, the support substrate 200 is used as a feeding layer for an inner part of the opening 220 to carry out electrolytic Cu plating so that Cu is deposited on the support substrate 200 in the opening 220 to form a Cu layer 440.

Figure 6E:
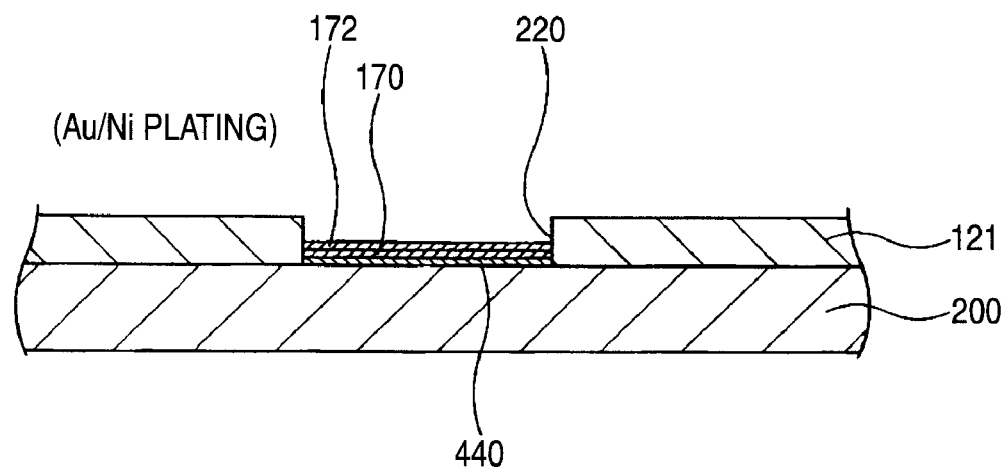
FIG. 6E is a view for explaining a method (No. 5) of manufacturing the wiring board according to the second example.

In FIG. 6E, the support substrate 200 is used as the feeding layer to carry out electrolytic plating so that Au is deposited on the Cu layer 440 in the opening 220 to form the Au layer 170, and furthermore, Ni is deposited on a surface of the Au layer 170 to arrange an Ni layer 172.

Figure 6F:
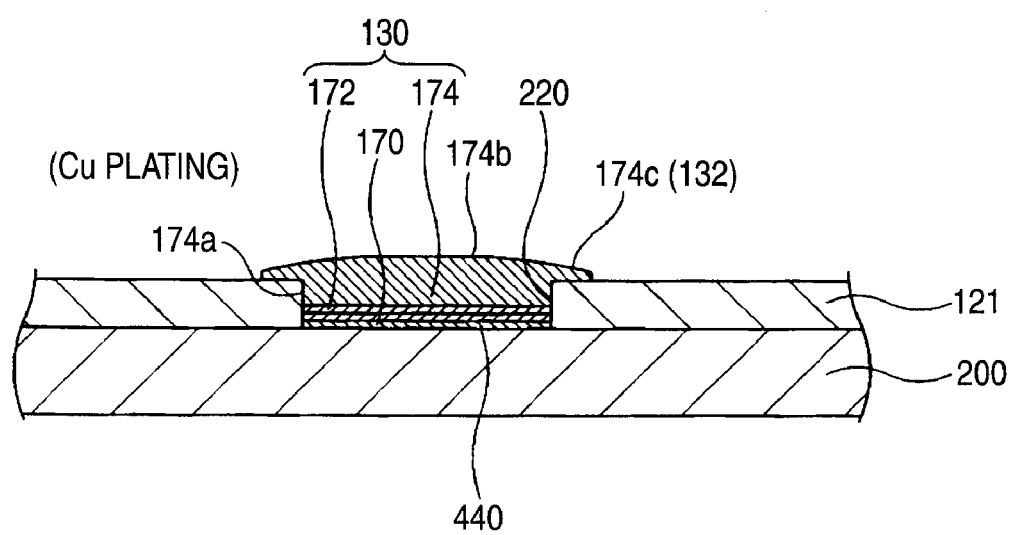
FIG. 6F is a view for explaining a method (No. 6) of manufacturing the wiring board according to the second example.
Figure 6G:
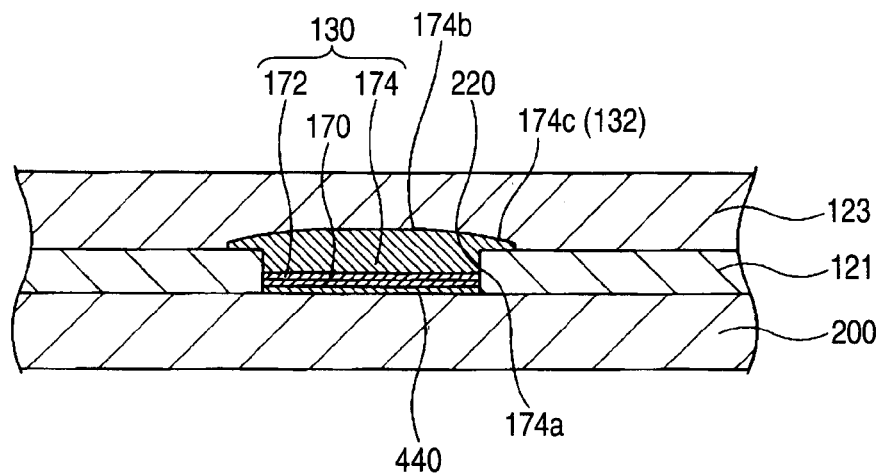
FIG. 6G is a view for explaining a method (No. 7) of manufacturing the wiring board according to the second example.
Figure 6H:
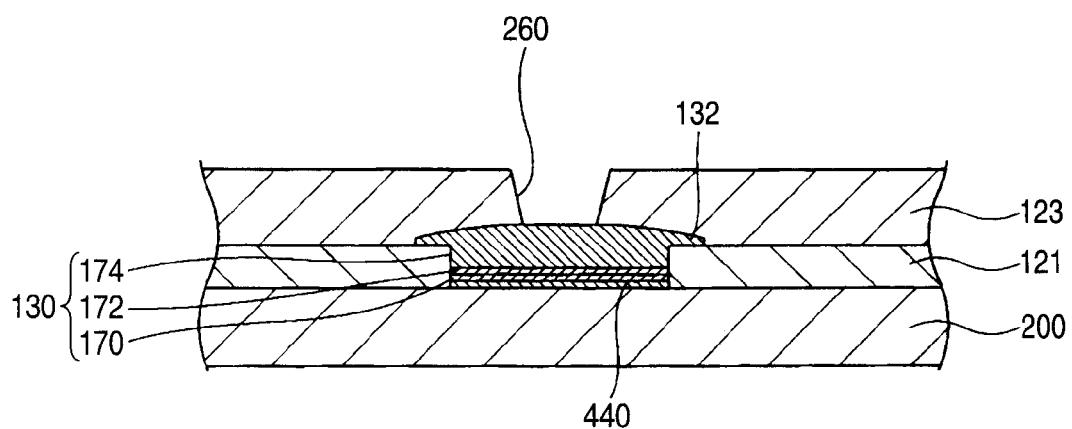
FIG. 6H is a view for explaining a method (No. 8) of manufacturing the wiring board according to the second example.
Figure 6I:
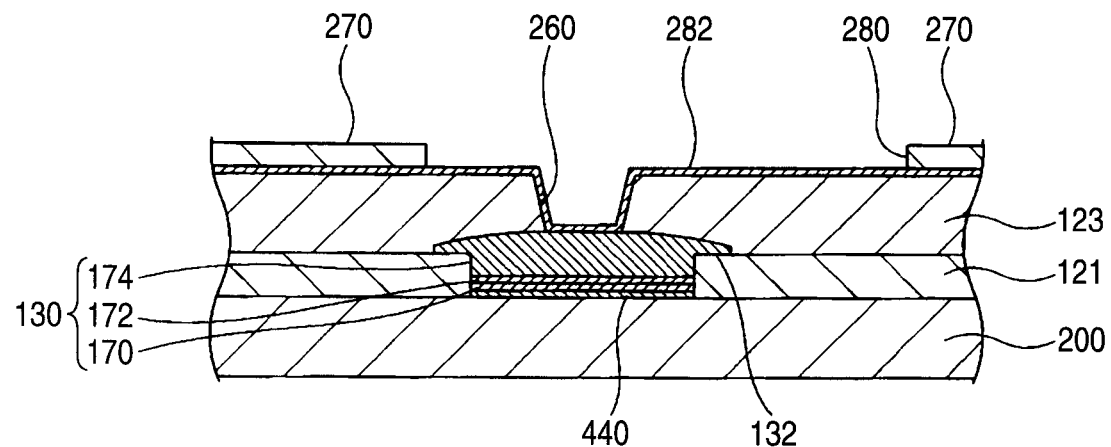
FIG. 6I is a view for explaining a method (No. 9) of manufacturing the wiring board according to the second example.
Figure 6J:
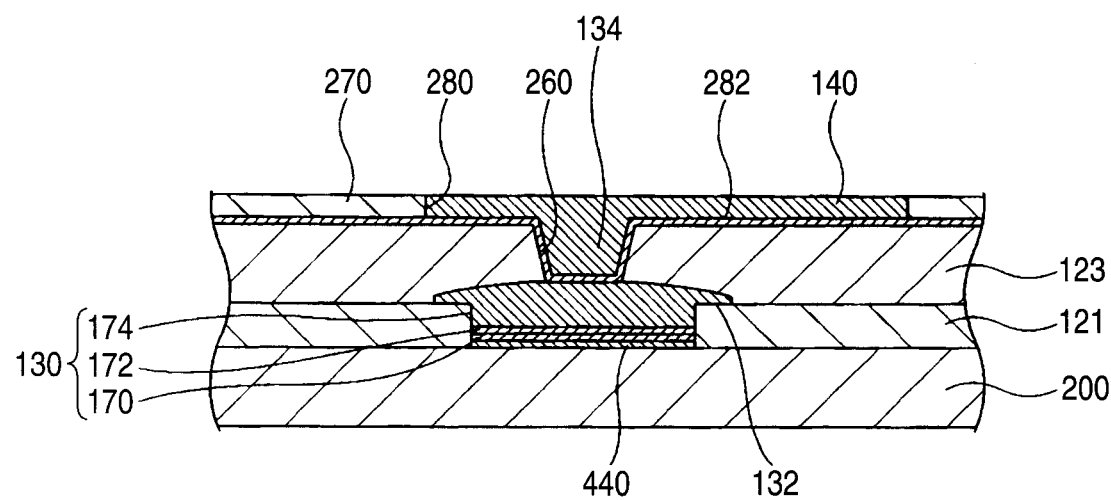
FIG. 6J is a view for explaining a method (No. 10) of manufacturing the wiring board according to the second example.
Figure 6K:
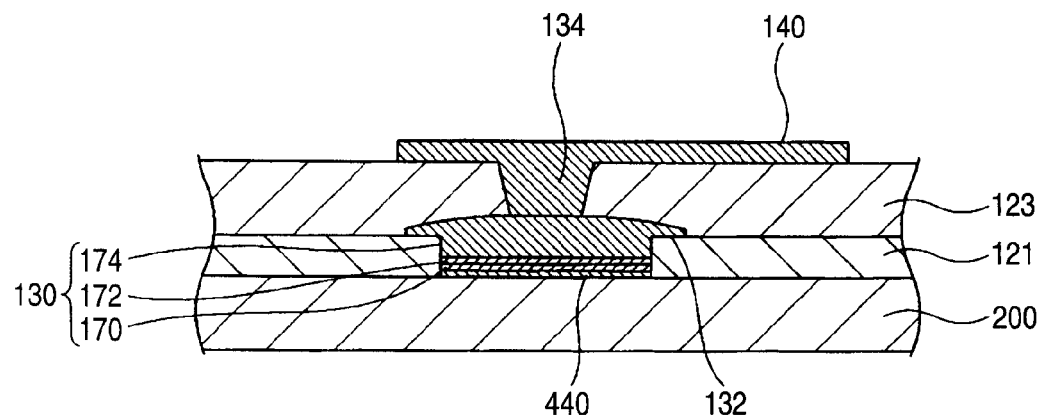
FIG. 6K is a view for explaining a method (No. 11) of manufacturing the wiring board according to the second example.
Figure 6L:
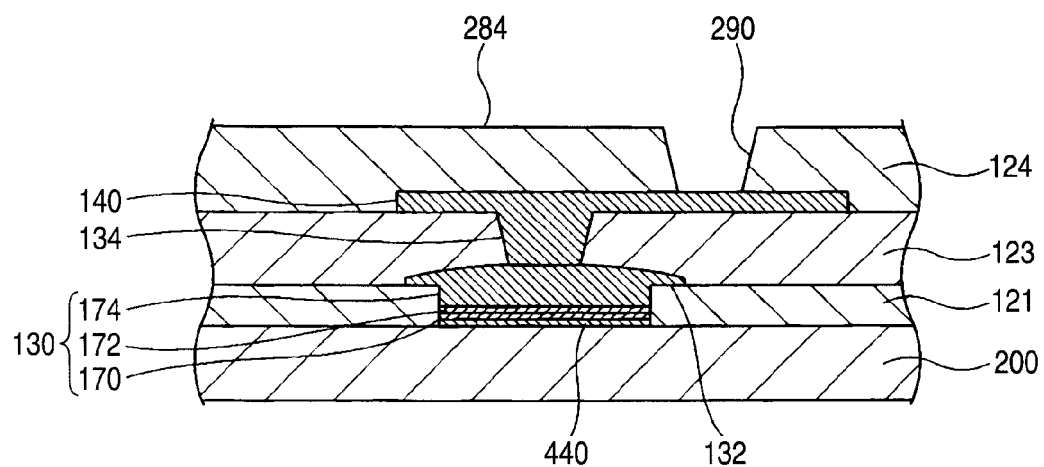
FIG. 6L is a view for explaining a method (No. 12) of manufacturing the wiring board according to the second example.
Figure 6M:
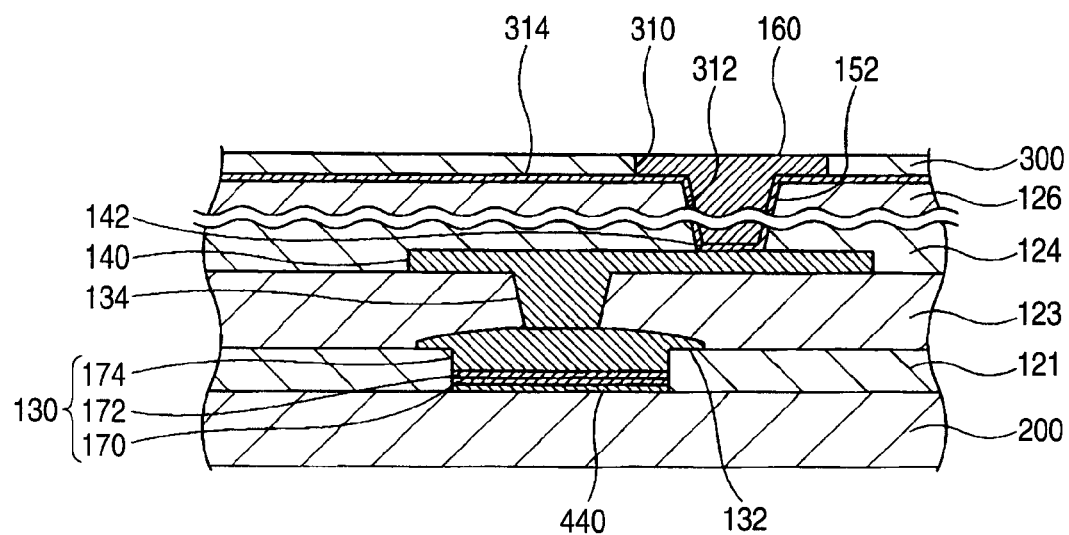
FIG. 6M is a view for explaining a method (No. 13) of manufacturing the wiring board according to the second example.

In FIG. 6F, furthermore, the support substrate 200 is used as the feeding layer to carry out the electrolytic plating so that Cu is deposited on Ni layer 172 in the opening 220 for forming a first electrode pad to arrange a Cu layer 174. The Cu layer 174 has a cylindrical portion 174a which is arranged in the opening 220 through the electrolytic Cu plating, a swollen portion 174b which is swollen upward from the upper surface of the first insulating layer 121 through a growth of Cu, and a flange portion 174c (forming the protruded portion 132) protruded in a radial direction (a circumferential direction) from the swollen portion 174b and formed on the upper surface of the first insulating layer 121.

A height of the swollen portion 174b and a protrusion length in a horizontal direction of the flange portion 174c in the Cu layer 174 can be set to have optional dimensions depending on a time required for the electrolytic Cu plating.

Since each insulating layer and each wiring layer are arranged and the same processings as those in the steps shown in FIGS. 3F to 3M according to the first example are carried out at steps shown in FIGS. 6G to 6N, description thereof will be omitted.

In FIG. 6O, the support substrate 200 is removed by wet etching and the Cu layer 440 is also removed so that the wiring board 420 is obtained. In the wiring board 420 according to the second example, the Cu layer 440 is removed so that the electrode opening 430 concaved from the surface of the first insulating layer 121 is formed on a lower surface side (a chip mounting side).

For the support substrate 200, it is also possible to stick two support substrates 200 in a vertical direction and to arrange the wiring board 420 on both surfaces at upper and lower surface sides thereof. In that case, the two support substrates 200 are divided into two parts and are removed by wet etching.

As shown in FIG. 5, then, a solder ball is put on the Au layer 170 of the electrode opening 430 and a reflow is carried out so that each terminal of the semiconductor chip 110 is connected to the first electrode pad 130 through the solder bump 180 and the semiconductor chip 110 is mounted on the wiring board 420. The step of mounting the semiconductor chip 110 on the wiring board 420 is properly selected. For example, there are the case in which the semiconductor chip 110 is mounted on the wiring board 420 according to a request of a customer and the case in which the semiconductor chip 110 is mounted on the wiring board 420 in a customer to which the wiring board 420 is delivered.

In the wiring board 420 according to the second example, thus, the electrode opening 430 which is concaved from the surface of the first insulating layer 121 is formed on the lower surface side (the chip mounting side). When the semiconductor chip 110 is to be mounted, therefore, the solder bump 180 is bonded to the Au layer 170 side of the first electrode pad 130 by carrying out a reflow (a heat treatment) over the electrode opening 430. Consequently, the solder bump 180 is reliably bonded to the first electrode pad 130 and a bonding strength in the radial direction is also increased by a peripheral edge portion of the electrode opening 430.

Moreover, the semiconductor chip 110 may be mounted on the wiring board 420 through wire bonding in place of the solder bump 180. Furthermore, the semiconductor chip 110 may be mounted on the wiring board 420 by soldering a pin in place of the solder bump 180.

Also in the second example, in the case in which a thermal stress is generated in a reflow due to the formation of the solder bump 180, a direction of advance of the thermal stress is blocked by the protruded portion 132 and is absorbed in a direction along the boundary surface between the first insulating layer 121 and the second insulating layer 123 because the protruded portion 132 which is protruded from the outer periphery of the first electrode pad 130 is formed to be protruded on a whole periphery in the radial direction (the circumferential direction). In the wiring board 420 according to the second example, therefore, it is possible to prevent a crack from being generated on the second insulating layer 123 in the same manner as in the first example.

Figure 7:
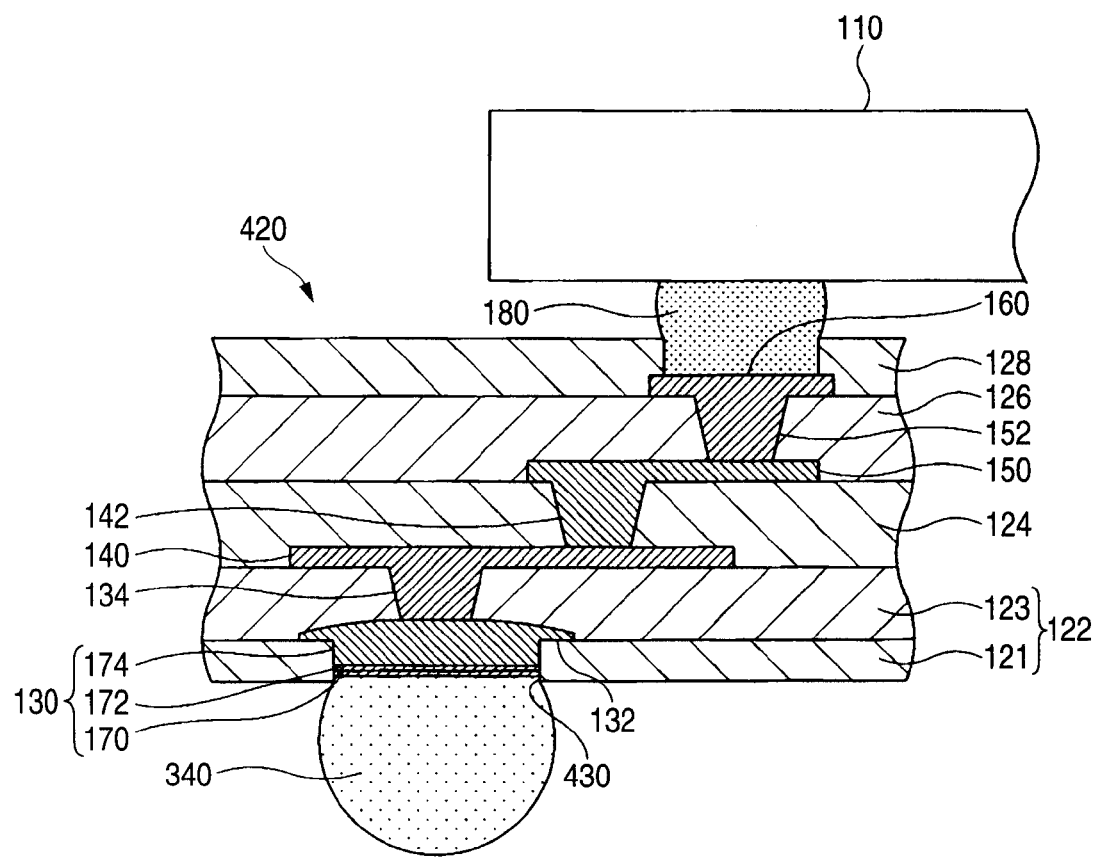
FIG. 7 is a view showing a variant of the second example.

FIG. 7 is a view showing a variant of the second example. As shown in FIG. 7, in the variant, the wiring board 420 is used in a reversely vertical direction to that in the case of the second example. More specifically, the semiconductor chip 110 is mounted on a second electrode pad 160 through the solder bump 180 and a solder bump 340 is formed on the first electrode pad 130 through a reflow of a solder ball. In this case, the solder bump 340 has a bonding strength in the radial direction increased by the peripheral edge portion of the electrode opening 430.

The semiconductor chip 110 may be mounted on either the first electrode pad 130 or the second electrode pad 160 in the wiring board 420 as shown in FIGS. 5 and 7.

In the variant, a plated layer having Au and Ni layers arranged (in such a manner that the Au layer is exposed to a surface) may be provided on the second electrode pad 160. Moreover, it is also possible to use Au/Pd/Ni, Sn/Ni, Sn—Ag (an alloy of tin and silver) and Sn in place of the Au layer 170 and the Ni layer 172. Furthermore, the first electrode pad 130 may be formed by only the metals. In addition, it is a matter of course that each metal is not restricted to the metals but is usable and a combination of the respective metals is not restricted to the combination.

Figure 6N:
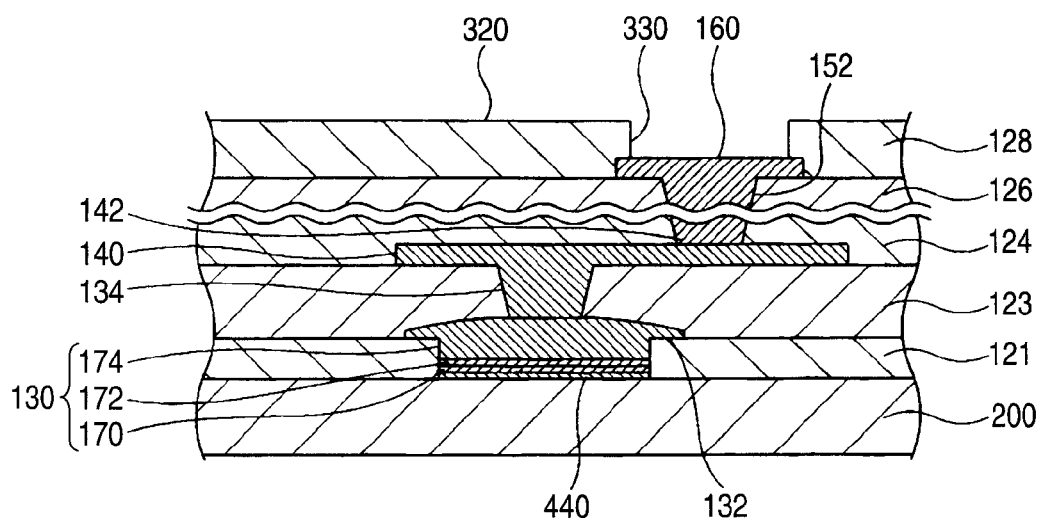
FIG. 6N is a view for explaining a method (No. 14) of manufacturing the wiring board according to the second example.
Figure 6O:
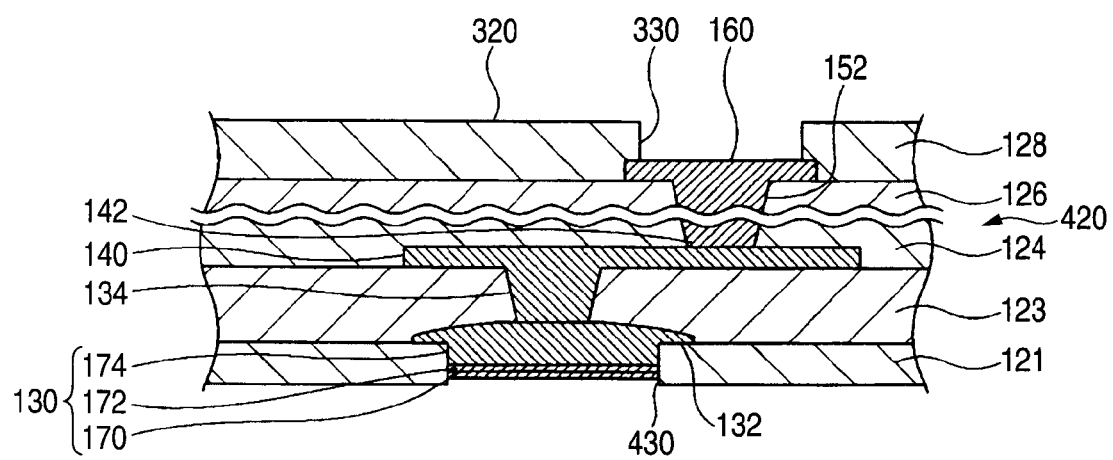
FIG. 6O is a view for explaining a method (No. 15) of manufacturing the wiring board according to the second example.

In the variant, furthermore, it is also possible to finish the semiconductor device by loading the semiconductor chip 110 onto the wiring board 420 and then removing the support substrate 200 at the step of FIG. 6N.

Also in the variant, an underfill resin having an insulating property may be filled between the semiconductor chip 110 and the wiring board 420.

Moreover, the semiconductor chip 110 may be mounted on the wiring board 420 through wire bonding in place of the solder bump 180. Furthermore, the semiconductor chip 110 may be mounted on the wiring board 420 by soldering a pin in place of the solder bump 180.

Third Example

Figure 8:
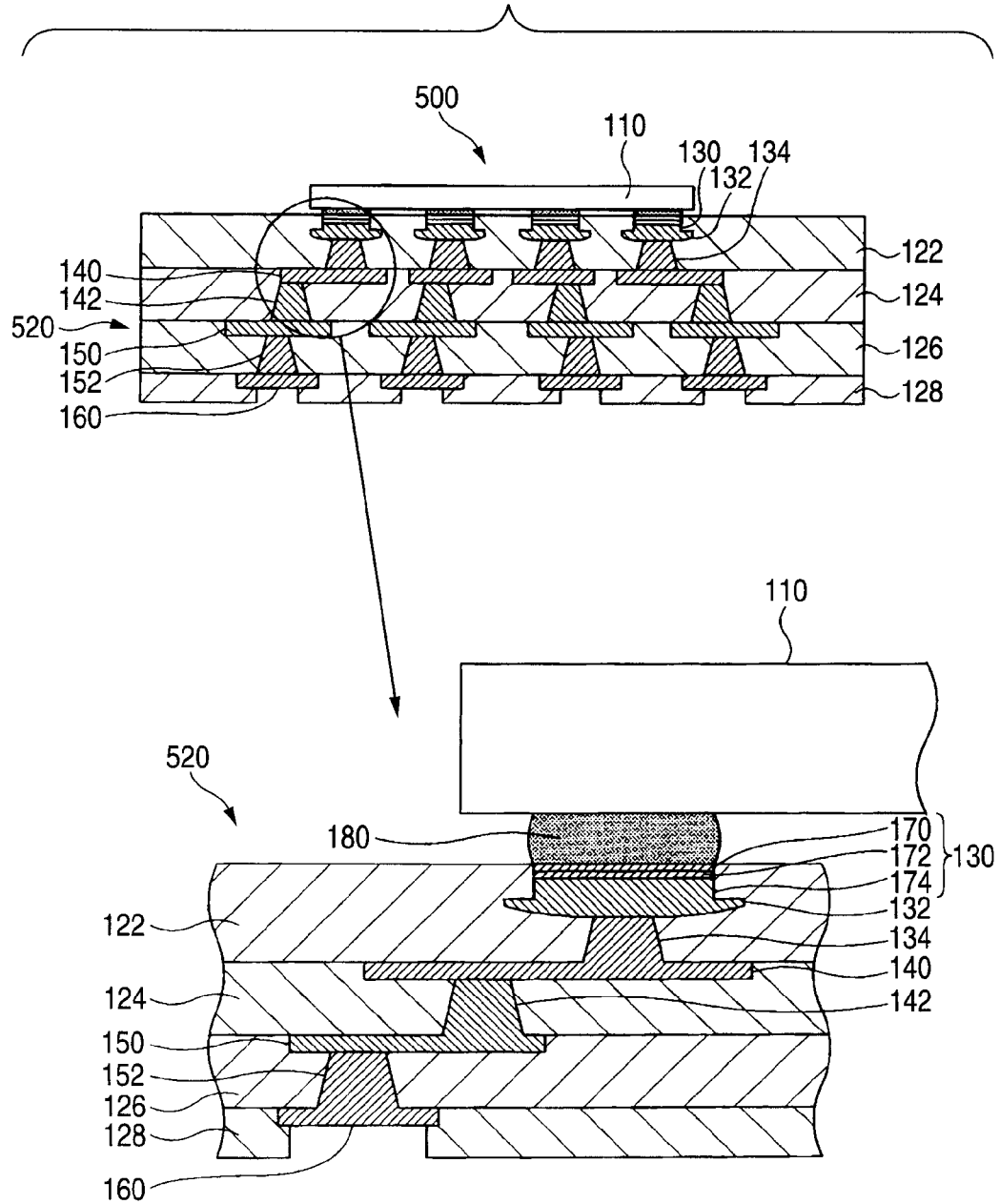
FIG. 8 is a longitudinal sectional view showing a semiconductor device to which a third example of the wiring board is applied.

FIG. 8 is a longitudinal sectional view showing a semiconductor device to which a third example of the wiring board is applied. In FIG. 8, the same portions as those in FIG. 1 have the same reference numerals and description thereof will be omitted.

As shown in FIG. 8, in a wiring board 520 to be used in a semiconductor device 500 according to the third example, an insulating layer of a first layer 122 is formed by one layer. In the semiconductor device 500 according to the third example, an underfill resin having an insulating property may be filled between the semiconductor chip 110 and the wiring board 520.

Figure 9A:
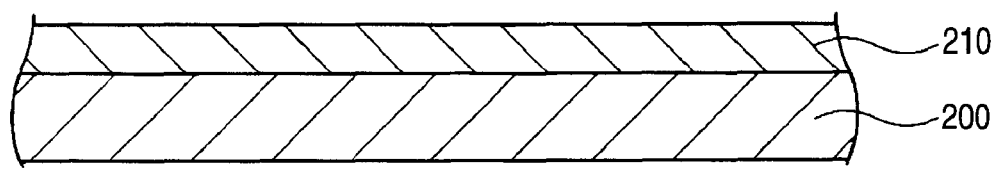
FIG. 9A is a view for explaining a method (No. 1) of manufacturing the wiring board according to the third example.

A method of manufacturing the wiring board 520 to be used in the semiconductor device 500 will be described with reference to FIGS. 9A to 9O. FIGS. 9A to 9O are views for explaining methods (Nos. 1 to 15) of manufacturing the wiring board 520 according to the third example. In FIGS. 9A to 9O, the respective layers are arranged in a facedown direction in which a first electrode pad 130 is provided on a lower surface side of the wiring board 520 (a vertically reverse direction to the lamination structure shown in FIG. 5).

In FIG. 9A, there is prepared a support substrate 200 formed by a flat Cu plate or a Cu foil which has a predetermined thickness, and a resin film (resist) 210 such as an epoxy resin or a polyimide resin is laminated as a plating resist on an upper surface of the support substrate 200.

Figure 9B:
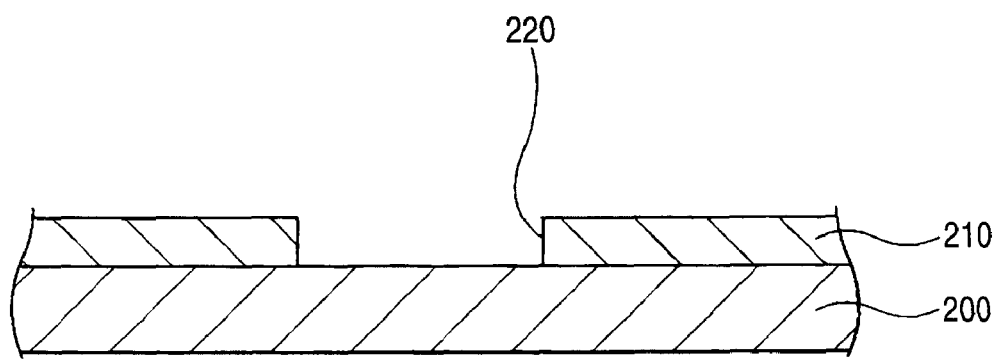
FIG. 9B is a view for explaining a method (No. 2) of manufacturing the wiring board according to the third example.

In FIG. 9B, an opening 220 for exposing a part of the support substrate 200 to the resin film 210 (through photolithography) is formed. An inside diameter of the opening 220 corresponds to an outside diameter of the first electrode pad 130.

Figure 9C:
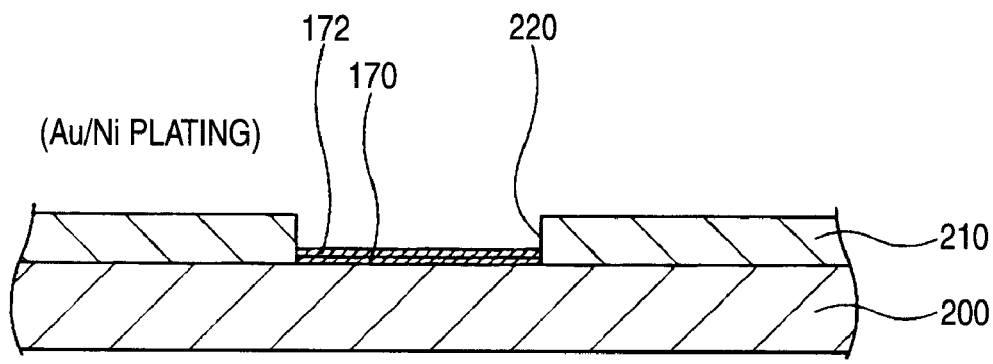
FIG. 9C is a view for explaining a method (No. 3) of manufacturing the wiring board according to the third example.

In FIG. 9C, the support substrate 200 is used as a feeding layer to carry out electrolytic plating so that Au is deposited on the support substrate 200 in the opening 220 to form an Au layer 170, and furthermore, Ni is deposited on a surface of the Au layer 170 to arrange an Ni layer 172.

Figure 9D:
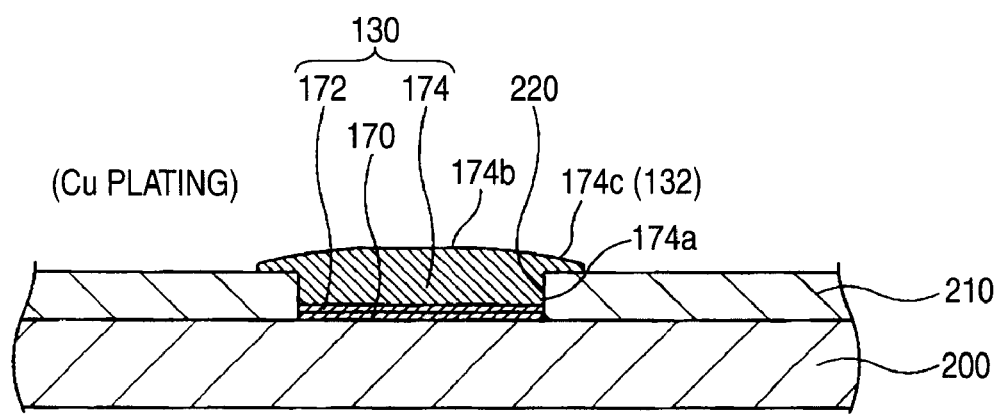
FIG. 9D is a view for explaining a method (No. 4) of manufacturing the wiring board according to the third example.

In FIG. 9D, furthermore, the support substrate 200 is used as the feeding layer to carry out the electrolytic plating so that Cu is deposited on the Ni layer 172 in the opening 220 to arrange a Cu layer 174, thereby forming the first electrode pad 130. The Cu layer 174 has a cylindrical portion 174a which is arranged in the opening 220 through the electrolytic Cu plating, a swollen portion 174b which is swollen upward from the upper surface of the resin film 210 through a growth of Cu, and a flange portion 174c which is protruded in a radial direction (a circumferential direction) from the swollen portion 174b and is formed on an upper surface of the resin film 210 (a peripheral edge portion on an upper end of the opening 220). The flange portion 174c has a larger diameter than that of an outer periphery of an upper end of the cylindrical portion 174a and forms a protruded portion 132.

A height of the swollen portion 174b and a protrusion length in a horizontal direction of the flange portion 174c in the Cu layer 174 can be set to have optional dimensions depending on a time required for the electrolytic Cu plating.

Figure 9E:
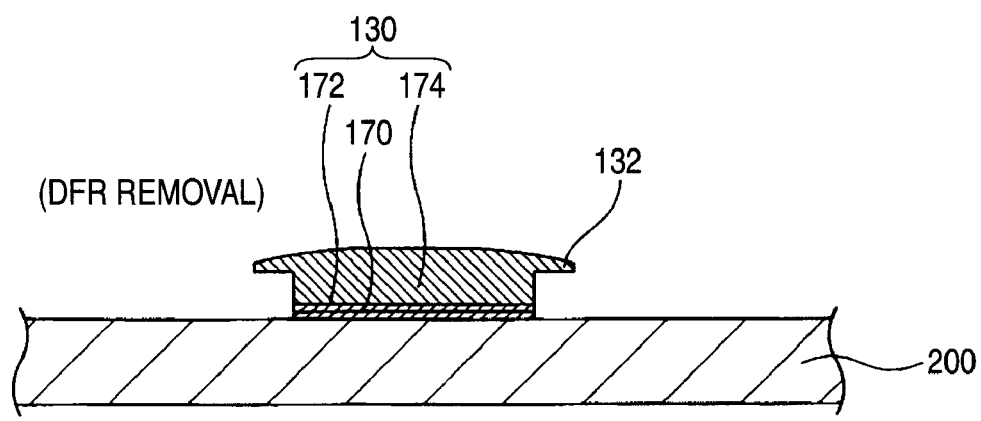
FIG. 9E is a view for explaining a method (No. 5) of manufacturing the wiring board according to the third example.

In FIG. 9E, the resin film 210 is removed from the support substrate 200 so that the first electrode pad 130 is left on the support substrate 200.

Figure 9F:
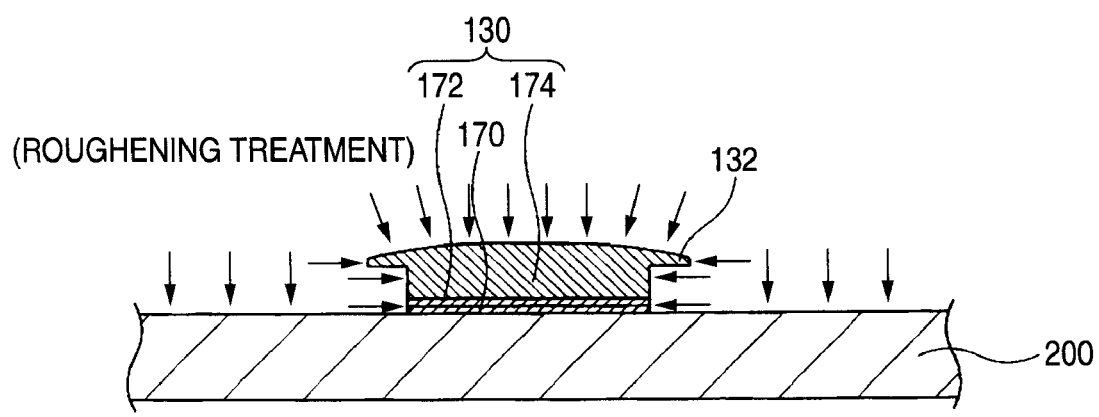
FIG. 9F is a view for explaining a method (No. 6) of manufacturing the wiring board according to the third example.

In FIG. 9F, a roughening treatment is carried out over the surfaces of the support substrate 200 and the electrode pad 130 to roughen the surfaces of the support substrate 200 and the electrode pad 130. It is preferable that a surface roughness obtained by the roughening treatment should be set to have Ra=approximately 0.25 to 0.75 μm, for example.

Figure 9G:
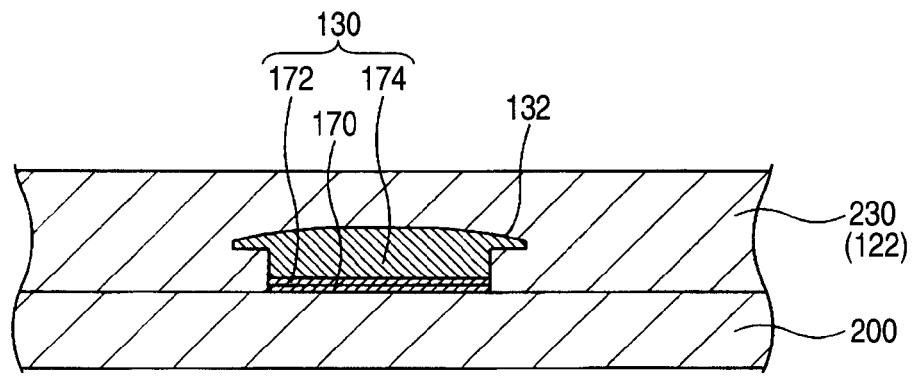
FIG. 9G is a view for explaining a method (No. 7) of manufacturing the wiring board according to the third example.

In FIG. 9G, a resin film 230 such as an epoxy resin or a polyimide resin is laminated on the surfaces of the support substrate 200 and the electrode pad 130 which are subjected to the roughening treatment, and an insulating layer of the first layer 122 is thus formed. The resin film 230 is laminated on the surfaces of the support substrate 200 and the electrode pad 130 by using a vacuum lamination method or a vacuum type hot press. For this reason, the resin film 230 is bonded by pressure to the upper surfaces and outer peripheral surfaces of the support substrate 200 and the first electrode pad 130 through a vacuum. Consequently, the resin film 230 is laminated on a lower side of the protruded portion 132 in the first electrode pad 130 in an adhering state without a clearance so that a void can be prevented from being generated. In addition, the surfaces of the support substrate 200 and the electrode pad 130 are roughened. Therefore, an adhesion of the resin film 230 to the electrode pad 130 can be enhanced so that a delamination can be prevented from being generated by a thermal stress.

Figure 9H:
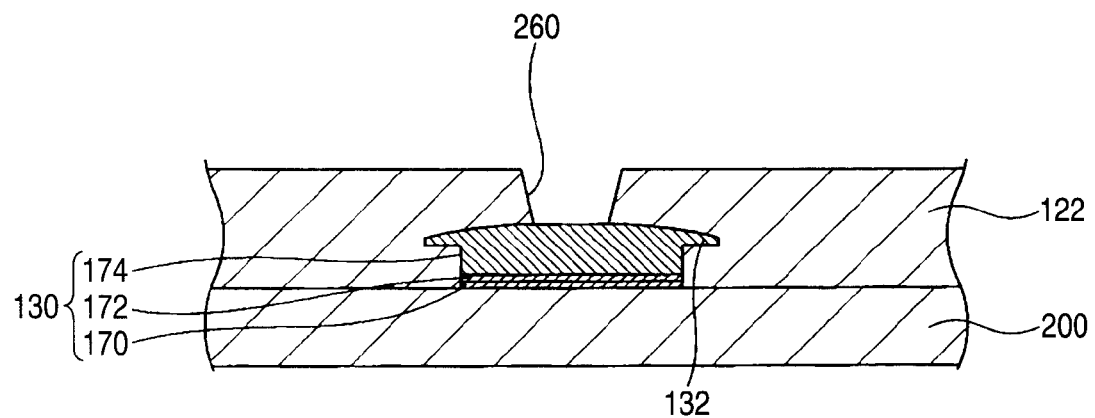
FIG. 9H is a view for explaining a method (No. 8) of manufacturing the wiring board according to the third example.

In FIG. 9H, a laser beam is irradiated on the insulating layer (the resin film 230) of the first layer 122 to form a via hole 260 in such a manner that a part of the surface of the first electrode pad 130 (the swollen portion 174b of the Cu layer 174) is exposed, for example.

Figure 9I:
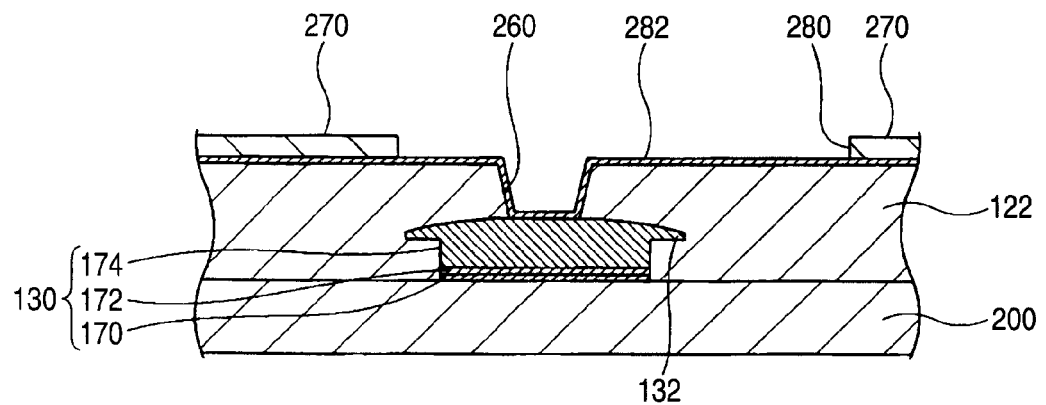
FIG. 9I is a view for explaining a method (No. 9) of manufacturing the wiring board according to the third example.

In FIG. 9I, a seed layer 282 is formed, by nonelectrolytic copper plating, on a surface of the insulating layer of the first layer 122, an internal surface of the via hole 260, and an upper surface of the Cu layer 174 which is exposed through the via hole 260. For a method of forming the seed layer 282, another thin film forming method (a sputtering method or a CVD method) may be used or a conducive metal other than Cu may be formed. Subsequently, a dry film resist 270 is laminated as a plating resist on the surface (the upper surface) of the seed layer 282. Then, patterning (exposure and development) is carried out over the dry film resist 270 to form an opening 280 for forming a wiring pattern through which a part of the seed layer 282 is exposed. A liquid resist may be applied in place of the dry film resist 270.

Figure 9J:
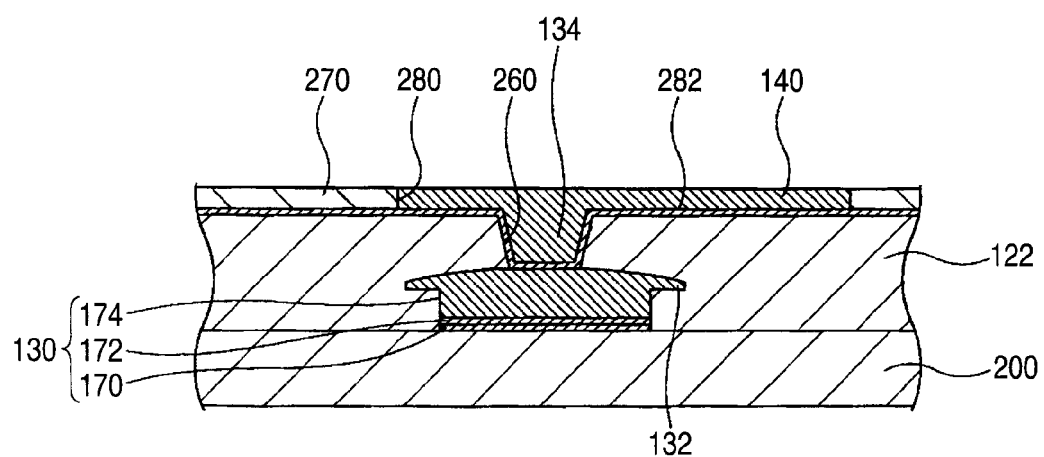
FIG. 9J is a view for explaining a method (No. 10) of manufacturing the wiring board according to the third example.

In FIG. 9J, electrolytic Cu plating is carried out by feeding the seed layer 282 so that Cu is deposited on the via hole 260 and the seed layer 282 in the opening 280 to form a via 134 and a wiring pattern layer 140.

Figure 9K:
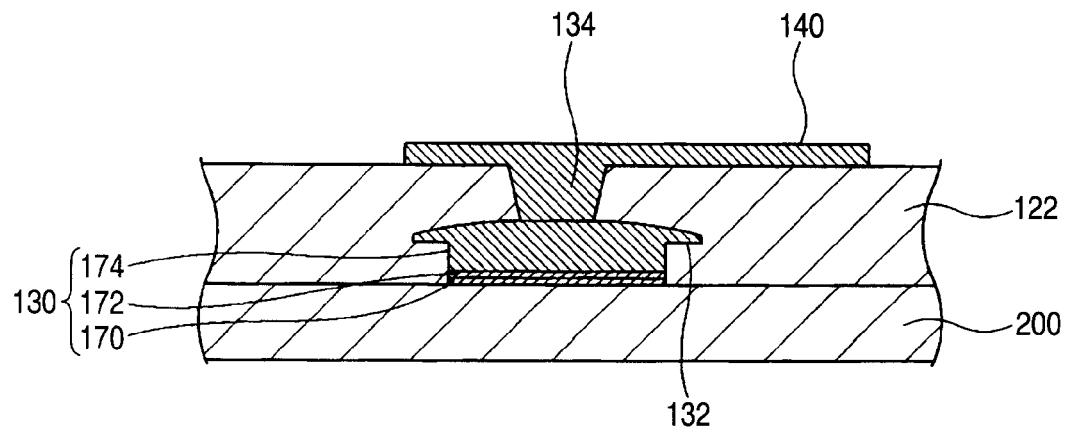
FIG. 9K is a view for explaining a method (No. 11) of manufacturing the wiring board according to the third example.

In FIG. 9K, the dry film resist 270 and the seed layer 282 other than the seed layer 282 provided under the wiring pattern layer 140 are removed. Consequently, the wiring pattern layer 140 is left on the insulating layer of the first layer 122. In FIG. 9K and succeeding drawings, the seed layer 282 is not shown.

Figure 9L:
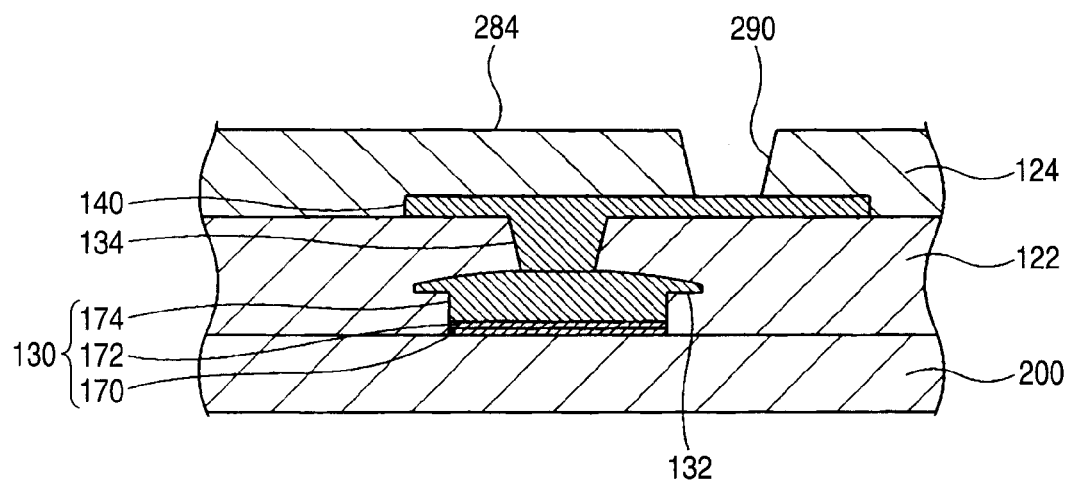
FIG. 9L is a view for explaining a method (No. 12) of manufacturing the wiring board according to the third example.

In FIG. 9L, a roughening treatment is carried out over the surfaces of the insulating layer of the first layer 122 and the wiring pattern layer 140 and a film-shaped so-called built-up resin 284 containing an epoxy resin as a main component (a content of a filler may be properly changed corresponding to a hardness or a flexibility which is required) is then laminated to form the insulating layer of a second layer 124. Thereafter, a laser beam is irradiated to form a via hole 290 in such a manner that a part of the surface of the wiring pattern layer 140 is exposed, for example.

Subsequently, the steps of FIGS. 9H to 9L are repeated to form a via 142 of the second layer 124 and a wiring pattern layer 150 of a third layer 126. In the case in which at least four insulating and wiring layers are to be arranged, moreover, it is preferable that the steps of FIGS. 9H to 9L should be correspondingly repeated.

Figure 9M:
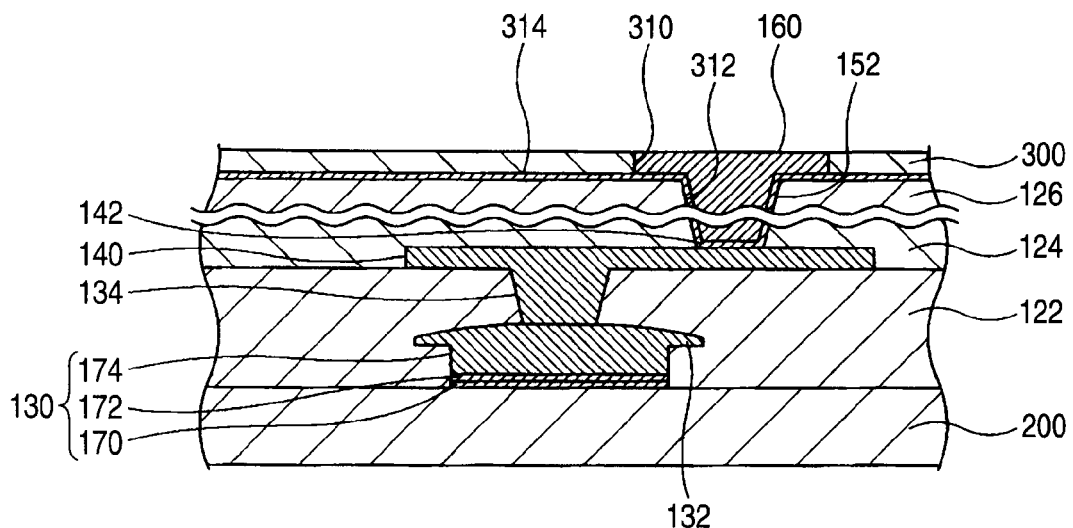
FIG. 9M is a view for explaining a method (No. 13) of manufacturing the wiring board according to the third example.

In FIG. 9M, a seed layer 314 is formed by Cu nonelectrolytic plating over the surface (upper surface) of the insulating layer of the third layer 126, and subsequently, a dry film resist 300 is laminated as a plating resist. A liquid resist may be applied in place of the dry film resist 300. For a method of forming the seed layer 314, moreover, a thin film forming method other than the nonelectrolytic Cu plating may be used or the seed layer 314 may be formed by a conductive metal other than Cu.

Then, patterning (exposure and development) is carried out over the dry film resist 300 to form an opening 310 for forming a second electrode pad in such a manner that a part of the seed layer 314 is exposed. Next, electrolytic Cu plating is carried out by feeding the seed layer 314 to deposit Cu in a via hole 312 and the opening 310, thereby forming a via 152 and a second electrode pad 160.

Figure 9N:
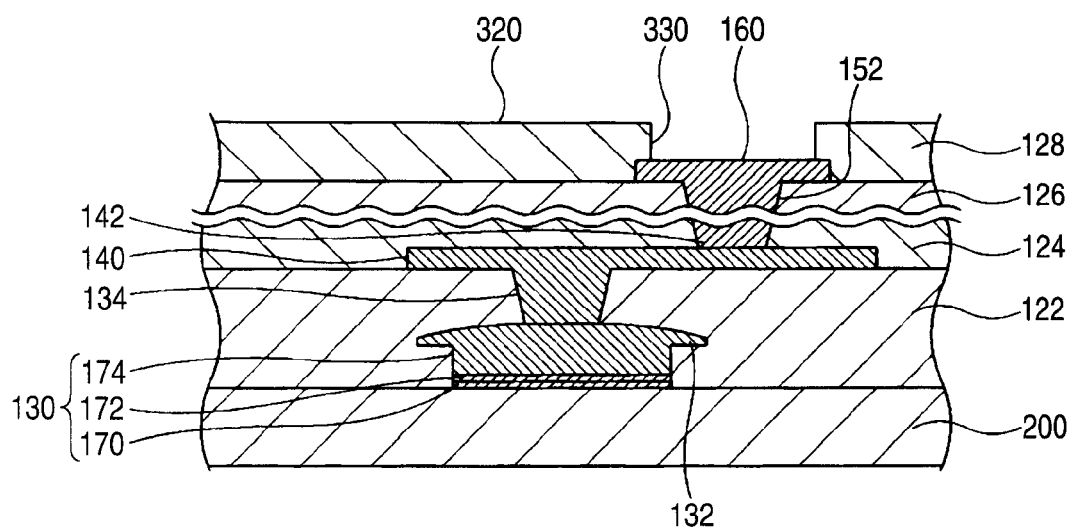
FIG. 9N is a view for explaining a method (No. 14) of manufacturing the wiring board according to the third example.
Figure 9O:
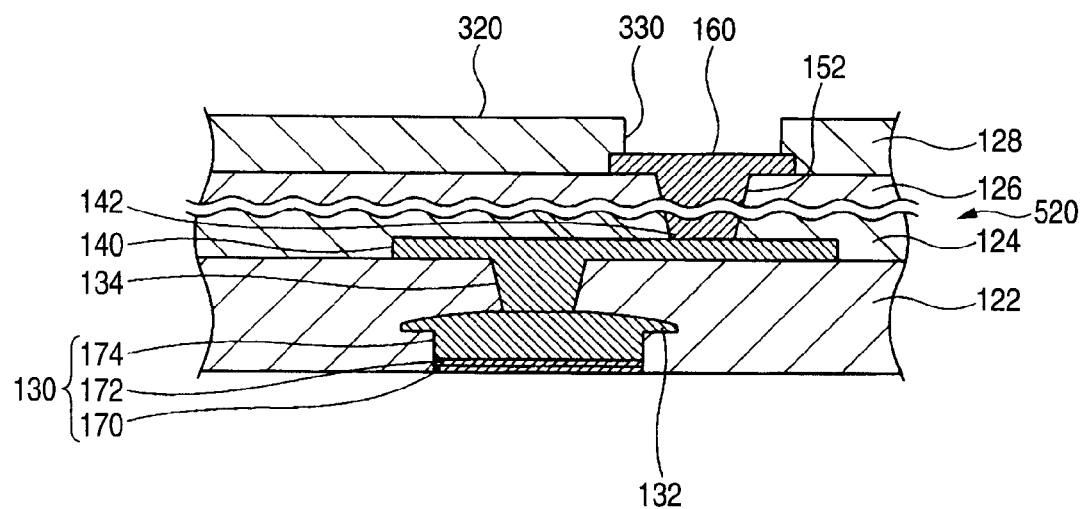
FIG. 9O is a view for explaining a method (No. 15) of manufacturing the wiring board according to the third example.

In FIG. 9N, the dry film resist 300 and the seed layer 314 other than the seed layer 314 provided under the second electrode pad 160 are removed. At steps to be carried out in FIG. 9N and the succeeding drawings, Cu in the seed layer 314 provided under the second electrode pad 160 is integrated. Therefore, the seed layer 314 is omitted.

Subsequently, a solder resist 320 is laminated on the surface (upper surface) of the insulating layer of the third layer 126 and the insulating layer of a fourth layer 128 is thus formed, and an opening 330 is then formed in such a manner that a part of the second electrode pad 160 is exposed.

In FIG. 9O, the support substrate 200 is removed by wet etching so that the wiring board 520 is obtained. For the support substrate 200, it is also possible to stick two support substrates 200 in a vertical direction and to arrange the wiring board 520 on both surfaces at upper and lower surface sides thereof. In that case, the two support substrates 200 are divided into two parts and are removed by wet etching.

As shown in FIG. 8, then, a solder ball is put on the first electrode pad 130 of the wiring board 520 and a reflow is carried out so that each terminal of the semiconductor chip 110 is connected to the electrode pad 130 through a solder bump 180 and the semiconductor chip 110 is mounted on the wiring board 520. The step of mounting the semiconductor chip 110 on the wiring board 520 is properly selected. For example, there are the case in which the semiconductor chip 110 is mounted on the wiring board 520 according to a request of a customer and the case in which the semiconductor chip 110 is mounted on the wiring board 520 in a customer to which the wiring board 520 is delivered.

Also in the third example, in the case in which a thermal stress is generated in a reflow due to the formation of the solder bump 180, a direction of advance of a thermal stress is blocked by the protruded portion 132 because the protruded portion 132 is formed to be protruded in a radial direction (a circumferential direction) from an outer periphery at one surface side of the first electrode pad 130. Thus, it is possible to prevent a crack from being generated on the insulating layer of the first layer 122.

Moreover, the semiconductor chip 110 may be mounted on the wiring board 520 through wire bonding in place of the solder bump 180. Furthermore, the semiconductor chip 110 may be mounted on the wiring board 520 by soldering a pin in place of the solder bump 180.

Figure 10:
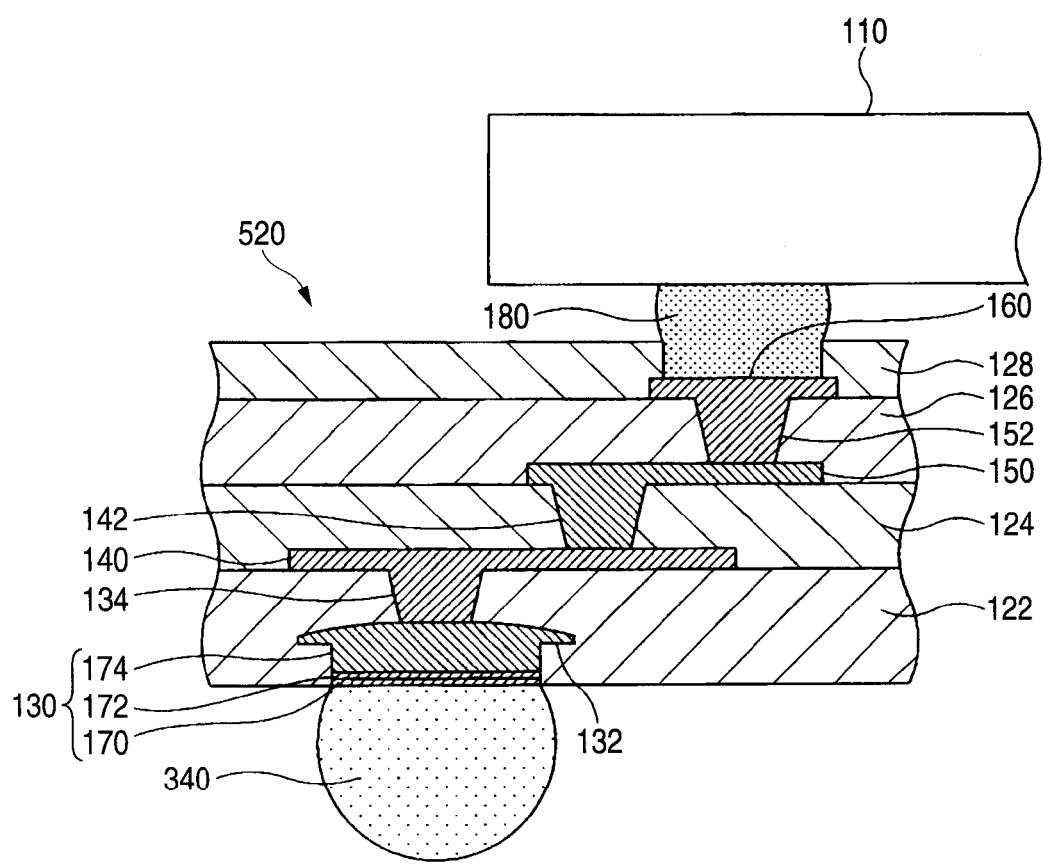
FIG. 10 is a view showing a variant of the third example.

FIG. 10 is a view showing a variant of the third example. As shown in FIG. 10, in the variant, the wiring board 520 is used in a reversely vertical direction to that in the case of the third example. More specifically, the semiconductor chip 110 is mounted on the second electrode pad 160 through the solder bump 180 and a solder bump 340 is formed on the first electrode pad 130 through a reflow of a solder ball.

The semiconductor chip 110 may be mounted on either the first electrode pad 130 or the second electrode pad 160 in wiring board 520 as shown in FIGS. 8 and 10.

In the variant, a plated layer having Au and Ni layers arranged (in such a manner that the Au layer is exposed to a surface) may be provided on the second electrode pad 160. Moreover, it is also possible to use Au/Pd/Ni, Sn/Ni, Sn—Ag (an alloy of tin and silver) and Sn in place of the Au layer 170 and the Ni layer 172. Furthermore, the first electrode pad 130 may be formed by only the metals. In addition, it is a matter of course that each metal is not restricted to the metals but is usable and a combination of the respective metals is not restricted to the combination.

In the variant, furthermore, it is also possible to finish the semiconductor device by loading the semiconductor chip 110 onto the wiring board 520 and then removing the support substrate 200 at the step of FIG. 9N.

Also in the variant, an underfill resin having an insulating property may be filled between the semiconductor chip 110 and the wiring board 520.

Moreover, the semiconductor chip 110 may be mounted on the wiring board 520 through wire bonding in place of the solder bump 180. Furthermore, the semiconductor chip 110 may be mounted on the wiring board 520 by soldering a pin in place of the solder bump 180.

Fourth Example

Figure 11:
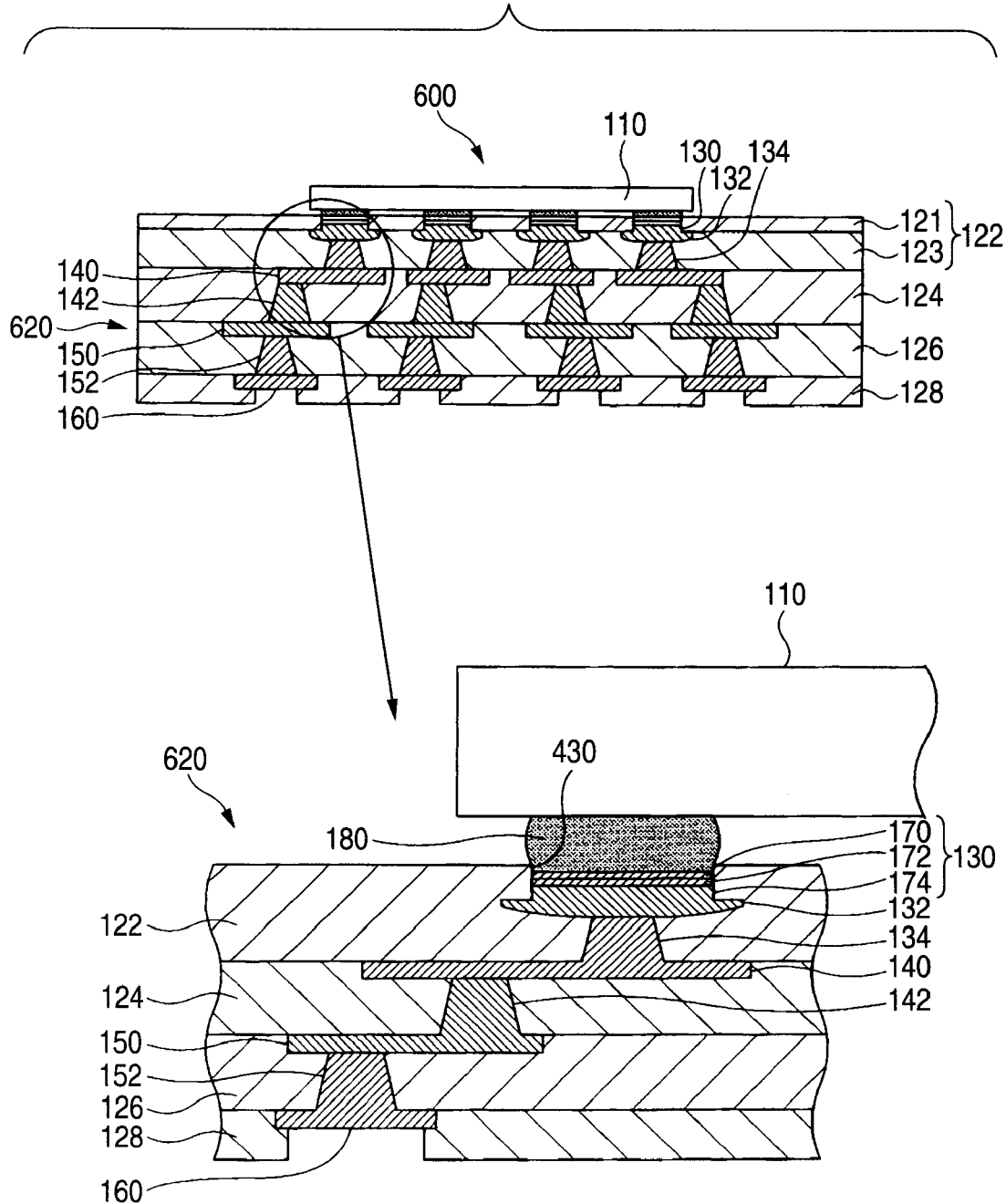
FIG. 11 is a longitudinal sectional view showing a semiconductor device to which a fourth example of the wiring board is applied.

FIG. 11 is a longitudinal sectional view showing a semiconductor device to which a fourth example of the wiring board is applied. In FIG. 11, the same portions as those according to each of the examples have the same reference numerals and description thereof will be omitted.

As shown in FIG. 11, in a wiring board 620 to be used in a semiconductor device 600 according to the fourth example, there is formed an electrode opening (a concave portion) 430 in which an exposed surface of a first electrode pad 130 (an end face on an Au layer 170 side) is concaved from a surface of a first layer 122. Therefore, a solder bump 180 is formed on the Au layer 170 side by carrying out a reflow (a heat treatment) with a solder ball inserted in the electrode opening 430. In the semiconductor device 600 according to the fourth example, an underfill resin having an insulating property may be filled between a semiconductor chip 110 and the wiring board 620.

Although a method of manufacturing the wiring board 620 to be used in the semiconductor device 600 is the same as the steps shown in FIGS. 9A to 9O according to the third example, it is different in that the Cu layer is arranged on the support substrate 200 at the step of FIG. 9C and is removed together with the support substrate 200 at the step of FIG. 9O.

In the fourth example, accordingly, the support substrate 200 is used as a feeding layer for an inner part of an opening 220 to carry out electrolytic Cu plating so that Cu is deposited on the support substrate 200 in the opening 220 to form a Cu layer 440 (see FIG. 6D) at the step of FIG. 9C. Subsequently, the support substrate 200 is used as the feeding layer to carry out electrolytic plating so that Au is deposited on the Cu layer 440 in the opening 220 to form the Au layer 170, and furthermore, Ni is deposited on a surface of the Au layer 170 to arrange an Ni layer 172. Furthermore, the support substrate 200 is used as the feeding layer to carry out the electrolytic plating so that Cu is deposited on the Ni layer 172 in the opening 220 for forming a first electrode pad to arrange a Cu layer 174.

At the step of FIG. 9O, moreover, the support substrate 200 is removed by wet etching and the Cu layer 440 is also removed so that the wiring board 620 is obtained. In the wiring board 620, the Cu layer 440 is removed so that the electrode opening 430 (see FIG. 6O) concaved from the surface of the first layer 122 is formed on a lower surface side (a chip mounting side).

Also in the fourth example, for the support substrate 200, it is also possible to stick two support substrates 200 in a vertical direction and to arrange the wiring board 620 on both surfaces at upper and lower surface sides thereof. In that case, the two support substrates 200 are divided into two parts and are removed by wet etching.

As shown in FIG. 11, then, a solder ball is put on the Au layer 170 of the electrode opening 430 and a reflow is carried out so that each terminal of the semiconductor chip 110 is connected to the first electrode pad 130 through the solder bump 180 and the semiconductor chip 110 is mounted on the wiring board 620. The step of mounting the semiconductor chip 110 on the wiring board 620 is properly selected. For example, there are the case in which the semiconductor chip 110 is mounted on the wiring board 620 according to a request of a customer and the case in which the semiconductor chip 110 is mounted on the wiring board 620 in a customer to which the wiring board 620 is delivered.

In the wiring board 620 according to the fourth example, thus, the electrode opening 430 which is concaved from the surface of the first layer 122 is formed on the lower surface side (the chip mounting side). When the semiconductor chip 110 is to be mounted, therefore, the solder bump 180 is bonded to the Au layer 170 side of the first electrode pad 130 by carrying out a reflow (a heat treatment) over the electrode opening 430. Consequently, the solder bump 180 is reliably bonded to the first electrode pad 130 and a bonding strength in a radial direction is also increased by a peripheral edge portion of the electrode opening 430.

Also in the fourth example, in the case in which a thermal stress is generated in a reflow due to the formation of the solder bump 180, a direction of advance of the thermal stress is blocked by a protruded portion 132 because the protruded portion 132 which is protruded from an outer periphery at one surface side of the first electrode pad 130 is formed to be protruded on a whole periphery in the radial direction (the circumferential direction). Thus, it is possible to prevent a crack from being generated on the insulating layer of the first layer 122.

Moreover, the semiconductor chip 110 may be mounted on the wiring board 620 through wire bonding in place of the solder bump 180. Furthermore, the semiconductor chip 110 may be mounted on the wiring board 620 by soldering a pin in place of the solder bump 180.

Figure 12:
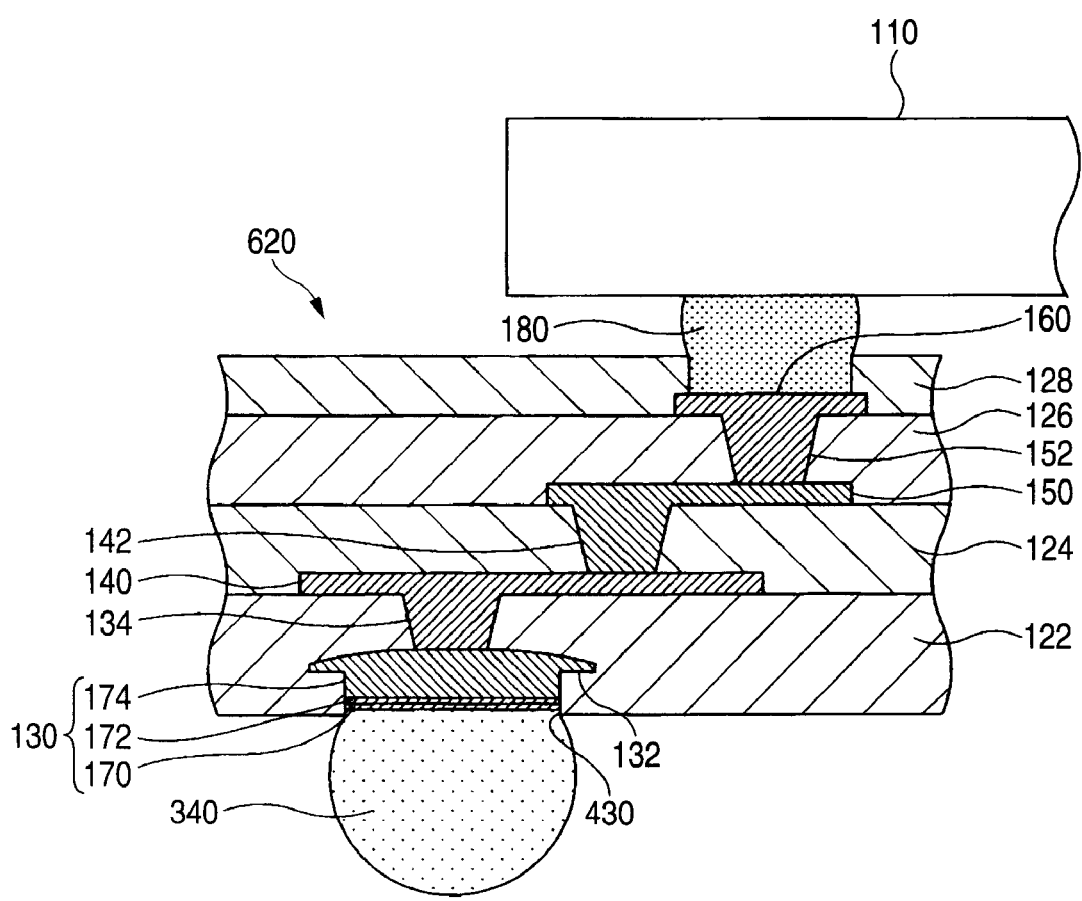
FIG. 12 is a view showing a variant of the fourth example.

FIG. 12 is a view showing a variant of the fourth example. As shown in FIG. 12, in the variant, the wiring board 620 is used in a reversely vertical direction to that in the case of the fourth example. More specifically, the semiconductor chip 110 is mounted on a second electrode pad 160 through the solder bump 180 and a solder bump 340 is formed on the first electrode pad 130 through a reflow of a solder ball. In this case, the solder bump 340 has a bonding strength in the radial direction increased by the peripheral edge portion of the electrode opening (concave portion) 430 concaved from the surface of the first layer 122 because the electrode opening 430 is formed.

The semiconductor chip 110 may be mounted on either the first electrode pad 130 or the second electrode pad 160 in the wiring board 620 as shown in FIGS. 11 and 12.

In the variant, a plated layer having Au and Ni layers arranged (in such a manner that the Au layer is exposed to a surface) may be provided on the second electrode pad 160. Moreover, it is also possible to use Au/Pd/Ni, Sn/Ni, Sn—Ag (an alloy of tin and silver) and Sn in place of the Au layer 170 and the Ni layer 172. Furthermore, the first electrode pad 130 may be formed by only the metals. In addition, it is a matter of course that each metal is not restricted to the metals but is usable and a combination of the respective metals is not restricted to the combination.

In the variant, furthermore, it is also possible to finish the semiconductor device by loading the semiconductor chip 110 onto the wiring board 620 and then removing the support substrate 200 at the step to be carried out before removing the support substrate 200.

Also in the variant, an underfill resin having an insulating property may be filled between the semiconductor chip 110 and the wiring board 620.

Moreover, the semiconductor chip 110 may be mounted on the wiring board 620 through wire bonding in place of the solder bump 180. Furthermore, the semiconductor chip 110 may be mounted on the wiring board 620 by soldering a pin in place of the solder bump 180.

It is a matter of course that the electrode pad according to the invention can be applied to an electrode pad for external connection such as BGA (Ball Grid Array), PGA (Pin Grid Array) or LGA (Land Grid Array) in addition to an electrode pad for semiconductor chip loading.

Moreover, the invention can be applied to a semiconductor device having a structure in which an electronic component is loaded onto a substrate or a structure in which a wiring pattern is formed on a substrate in addition to the semiconductor device having the structure in which the solder bump 180 is formed. Therefore, it is a matter of course that the invention can also be applied to a flip chip to be bonded onto a substrate through a solder bump or a multilayer substrate or an interposer to which a circuit board is bonded through a solder bump, for example.

What is claimed is:
1. A method of manufacturing a wiring board, comprising:
a first step of forming a resist on a support substrate;
a second step of forming, on the resist, an opening for exposing the support substrate;
a third step of forming, on the opening, an electrode pad having a protruded portion which is protruded in a circumferential direction from the opening provided on the resist;
a fourth step of removing the resist;
a fifth step of forming an insulating layer to cover a surface of the electrode pad;
a sixth step of forming, on a surface of the insulating layer, a wiring layer to be electrically connected to the electrode pad; and a seventh step of removing the support substrate to expose the electrode pad.

2. The method of manufacturing a wiring board according to claim 1, further comprising:
a step of removing the resist and then carrying out a roughening treatment over the surface of the electrode pad.

3. The method of manufacturing a wiring board according to claim 1, wherein
the support substrate is formed of a metal;
the third step includes a step of forming a metal layer of the same type as the support substrate between the support substrate and the electrode pad; and
the seventh step serves to remove the support substrate and to remove the metal layer in such a manner that an exposed surface of the electrode pad forms a concave portion.

4. A method of manufacturing a semiconductor device using the method of manufacturing a wiring board according to claim 1, comprising the step of:
mounting a semiconductor chip on the electrode pad through a solder bump.

* * * * *